(12) United States Patent
Ishihara et al.

(10) Patent No.: US 10,718,816 B2
(45) Date of Patent: Jul. 21, 2020

(54) METHOD OF EVALUATING POWER STORAGE DEVICE, EVALUATION JIG, AND METHOD OF MANUFACTURING POWER STORAGE DEVICE

(71) Applicant: TOYOTA JIDOSHA KABUSHIKI KAISHA, Toyota-shi, Aichi-ken (JP)

(72) Inventors: Yuya Ishihara, Miyoshi (JP); Kensaku Miyazawa, Toyota (JP); Tetsuya Kaneko, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 45 days.

(21) Appl. No.: 16/222,170

(22) Filed: Dec. 17, 2018

(65) Prior Publication Data

US 2019/0195959 A1    Jun. 27, 2019

(30) Foreign Application Priority Data

Dec. 26, 2017  (JP) .................................. 2017-249276

(51) Int. Cl.

| | |
|---|---|
| *H01M 10/48* | (2006.01) |
| *H01G 13/00* | (2013.01) |
| *G01R 31/385* | (2019.01) |
| *H01M 10/42* | (2006.01) |
| *H01G 11/84* | (2013.01) |
| *G01R 31/36* | (2020.01) |
| *G01R 31/64* | (2020.01) |

(52) U.S. Cl.
CPC ....... *G01R 31/385* (2019.01); *G01R 31/3646* (2019.01); *H01G 11/84* (2013.01); *H01M 10/4285* (2013.01); *G01R 31/64* (2020.01)

(58) Field of Classification Search
CPC .. G01R 31/385; G01R 31/3646; G01R 31/64; H01G 11/84; H01M 10/4285
See application file for complete search history.

(56) References Cited

U.S. PATENT DOCUMENTS

| 7,968,221 | B2 * | 6/2011 | Hatanaka | ................ H01M 4/62 |
| | | | | 429/161 |
| 9,935,344 | B2 * | 4/2018 | Sawanishi | ......... H01M 10/4285 |
| 2011/0068800 | A1 | 3/2011 | Nishino et al. | |
| 2019/0162771 | A1 * | 5/2019 | Miyazawa | ........ H01M 10/4285 |

FOREIGN PATENT DOCUMENTS

| JP | 2010-250954 A | 11/2010 |
| KR | 10-2011-0021970 A | 3/2011 |

* cited by examiner

*Primary Examiner* — David M. Gray
*Assistant Examiner* — Michael A Harrison
(74) *Attorney, Agent, or Firm* — Sughrue Mion, PLLC

(57) ABSTRACT

(a) A power storage device is prepared. (b) An evaluation jig is prepared. The evaluation jig includes an insulating tubular member and a conductive needle-shaped member. (c) A charge level of the power storage device is adjusted. (d) A positive electrode or a negative electrode is selected as a reference electrode. (e) An operation to insert the evaluation jig into the power storage device is performed. (f) The insertion operation is controlled to stop the tubular member when a tip end of the needle-shaped member comes in contact with an electrode different from the reference electrode. (g) Short-circuiting through the needle-shaped member is caused. (h) The power storage device is evaluated based on a state of the short-circuiting power storage device.

5 Claims, 26 Drawing Sheets

METHOD OF EVALUATING POWER STORAGE DEVICE, EVALUATION JIG, AND METHOD OF MANUFACTURING POWER STORAGE DEVICE

This nonprovisional application is based on Japanese Patent Application No. 2017-249276 filed with the Japan Patent Office on Dec. 26, 2017, the entire contents of which are hereby incorporated by reference.

BACKGROUND

Field

The present disclosure relates to a method of evaluating a power storage device, an evaluation jig, and a method of manufacturing a power storage device.

Description of the Background Art

Japanese Patent Laying-Open No. 2010-250954 discloses an evaluation method of forcibly causing internal short-circuiting in a power storage device by inserting into the power storage device, a prescribed evaluation jig to a depth where internal short-circuiting occurs.

SUMMARY

A method of evaluating which state a power storage device reaches (for example, a battery or a capacitor) when internal short-circuiting occurs due to a conductive foreign matter (for example, a metal piece) in the power storage device has been demanded.

"5.5 Forced internal short circuit test of cells" in "JIS C 8714 safety tests for portable lithium ion secondary cells and batteries for use in portable electronic applications" has been known as a simulation test for internal short-circuiting due to a conductive foreign matter.

In the forced internal short circuit test, a charged battery is disassembled and an electrode assembly is taken out of a housing of the battery. A small nickel piece (a conductive foreign matter) is inserted into the electrode assembly. The electrode assembly includes a stack portion which is formed by alternately stacking at least one positive electrode and at least one negative electrode. The small nickel piece is arranged between a positive electrode and a negative electrode located on an outermost side of the stack portion. The small nickel piece causes local internal short-circuiting.

Local internal short-circuiting is desirably short-circuiting between one positive electrode and one negative electrode (which is also denoted as "short-circuiting between single layers" below), because short-circuiting between single layers is considered to occur when a conductive foreign matter is actually introduced in a power storage device.

In the forced internal short circuit test, short-circuiting between single layers tends to occur. In the forced internal short circuit test, however, a prescribed dry room is required for performing an operation to disassemble a power storage device. In addition, high skills are also required for the operation to disassemble the charged power storage device.

Japanese Patent Laying-Open No. 2010-250954 has proposed a test alternative to the forced internal short circuit test. In Japanese Patent Laying-Open No. 2010-250954, a prescribed evaluation jig is used. The evaluation jig is such a jig that a conductive member is provided at a tip end of an insulating rod. The evaluation jig is inserted into the power storage device from the outside of the power storage device to a depth where internal short-circuiting is caused. An evaluation method in Japanese Patent Laying-Open No. 2010-250954 is easier in operation than the forced internal short circuit test and is considered as being able to cause local internal short-circuiting as in the forced internal short circuit test.

In Japanese Patent Laying-Open No. 2010-250954, a voltage of a power storage device (a potential difference between the positive electrode and the negative electrode) is used as a condition for stopping the evaluation jig. When an amount of lowering in voltage exceeds a threshold value in the power storage device, insertion of the evaluation jig is stopped. Power storage devices, however, can be various in capacity. Inconvenience as below may be caused in the power storage device high in capacity.

As the power storage device is higher in capacity, a ratio of a capacity lost due to local internal short-circuiting to the capacity of the power storage device is lower. Therefore, as the power storage device is higher in capacity, an amount of lowering in voltage due to local internal short-circuiting also becomes smaller. In a power storage device high in capacity, a plurality of positive electrodes and a plurality of negative electrodes may have been short-circuited through a conductive member at the time point of lowering in voltage to a detectable extent. Namely, it may be difficult to control the number of electrodes involved with short-circuiting (which is also denoted as "the number of short-circuited layers" below) in the power storage device high in capacity.

The housing may electrically be connected to the positive electrode or the negative electrode. In this case, the positive electrode and the negative electrode can be short-circuited to each other through the conductive member and the housing when the evaluation jig penetrates the housing. Consequently, local internal short-circuiting between electrodes may not be simulated.

An object of the present disclosure is to provide a method of evaluating a power storage device with which the number of short-circuited layers is controllable.

Technical features and functions and effects of the present disclosure will be described below. A functional mechanism of the present disclosure, however, includes presumption. The scope of claims should not be limited by whether or not the functional mechanism is correct.

[1] A method of evaluating a power storage device according to the present disclosure includes at least (a) to (h) below.

(a) A power storage device is prepared. The power storage device includes at least a housing and an electrode assembly. The electrode assembly is accommodated in the housing. The electrode assembly includes a positive electrode and a negative electrode. At least one positive electrode and at least one negative electrode are alternately stacked to form a stack portion in the electrode assembly.

(b) An evaluation jig is prepared. The evaluation jig includes an insulating tubular member and a conductive needle-shaped member. The needle-shaped member is inserted through the tubular member. The needle-shaped member is constructed to be movable independently of the tubular member.

(c) A charge level of the power storage device is adjusted to produce a first potential difference between the positive electrode and the negative electrode.

(d) The positive electrode or the negative electrode is selected as a reference electrode.

(e) An operation to insert the evaluation jig into the power storage device such that a portion other than a tip end of the needle-shaped member and the housing are separated from each other by the tubular member is performed.

(f) The insertion operation is controlled to stop the tubular member when the tip end of the needle-shaped member comes in contact with an electrode different from the reference electrode in the stack portion.

(g) Short-circuiting through the needle-shaped member is caused by moving the needle-shaped member independently of the tubular member after the tubular member is stopped.

(h) The power storage device is evaluated based on a state of the power storage device that is short-circuiting.

Contact between the electrode different from the reference electrode and the tip end of the needle-shaped member is detected based on variation in second potential difference between the reference electrode and the needle-shaped member. Occurrence of short-circuiting through the needle-shaped member is detected based on variation in second potential difference.

In the method of evaluating a power storage device according to the present disclosure, the positive electrode or the negative electrode may electrically be connected to the housing. The positive electrode and the negative electrode may not electrically be connected to the housing. By way of example, an aspect in which the positive electrode and the housing are electrically connected to each other is described here.

A potential difference (a first potential difference and a second potential difference) herein is represented by an absolute value thereof.

FIG. 1 is a first conceptual diagram for illustrating a method of evaluating a power storage device according to the present disclosure.

An electrode assembly is accommodated in a housing 90. The electrode assembly includes a positive electrode 10 and a negative electrode 20. A stack portion 50 is formed by alternately stacking at least one positive electrode 10 and at least one negative electrode 20. A direction of a y axis in FIG. 1 corresponds to a direction of stack of positive electrode 10 and negative electrode 20. A separator 30 is arranged between positive electrode 10 and negative electrode 20. In the method of evaluating a power storage device according to the present disclosure, however, it is considered that a power storage device without including separator 30 (for example, an all-solid-state battery) can also be evaluated. In FIG. 1, positive electrode 10 and housing 90 are electrically connected to each other.

An evaluation jig 5 is prepared. Evaluation jig 5 includes an insulating tubular member 1 and a conductive needle-shaped member 2. Needle-shaped member 2 is inserted through tubular member 1. Needle-shaped member 2 is constructed to be movable independently of tubular member 1.

A first potential difference ($\Delta V1$) is produced between positive electrode 10 and negative electrode 20 by adjusting a charge level. In the method of evaluating a power storage device according to the present disclosure, a second potential difference ($\Delta V2$) between a reference electrode and needle-shaped member 2 is measured. In FIG. 1, positive electrode 10 is electrically connected to needle-shaped member 2 with a voltage measurement device 502 (voltmeter) being interposed. In this example, positive electrode 10 is adopted as the reference electrode. Negative electrode 20 may naturally be adopted as the reference electrode.

At time point t1, needle-shaped member 2 is not yet in contact with housing 90. At time point t1, the second potential difference ($\Delta V2$) between positive electrode 10 (reference electrode) and needle-shaped member 2 is considered as being substantially 0 V.

As evaluation jig 5 is inserted in the power storage device, at time point t2, a tip end of needle-shaped member 2 comes in contact with housing 90. The second potential difference ($\Delta V2$) at time point t2 is considered as still remaining at 0 V. This is because housing 90 is electrically connected to positive electrode 10. In other words, housing 90 is equal in potential to positive electrode 10.

Evaluation jig 5 is inserted into the power storage device such that a portion other than the tip end of needle-shaped member 2 and housing 90 are separated from each other by tubular member 1. Evaluation jig 5 penetrates housing 90 and is inserted into stack portion 50. At time point t3, the tip end of needle-shaped member 2 comes in contact with negative electrode 20. Negative electrode 20 is an electrode different from the reference electrode (positive electrode 10).

At time point t3, the second potential difference ($\Delta V2$) is considered to increase up to the first potential difference ($\Delta V1$) between positive electrode 10 and negative electrode 20. It is considered that contact between the tip end of needle-shaped member 2 and the electrode different from the reference electrode is detected based on variation (increase in this example) in second potential difference ($\Delta V2$).

FIG. 2 is a second conceptual diagram for illustrating the method of evaluating a power storage device according to the present disclosure.

FIG. 2 conceptually shows a circuit at time point t3 in FIG. 1. In the presence of insulating tubular member 1, no current is considered to flow through a current path through needle-shaped member 2 and housing 90. It is considered that voltage measurement device 502 is connected in parallel to the current path which connects positive electrode 10 and negative electrode 20 to each other. Therefore, voltage measurement device 502 is considered to detect a first potential difference ($\Delta V1$) between positive electrode 10 and negative electrode 20.

After time point t3, tubular member 1 is stopped. As shown in FIG. 1, after time point t3, needle-shaped member 2 is moved independently of tubular member 1. As needle-shaped member 2 is inserted deeper into stack portion 50, needle-shaped member 2 passes through negative electrode 20 and separator 30. At time point t4, needle-shaped member 2 comes in contact with positive electrode 10. At time point t4, the second potential difference ($\Delta V2$) between the reference electrode and needle-shaped member 2 is considered as decreasing. This may be because a potential difference between the electrode (positive electrode 10) with which the tip end of needle-shaped member 2 is in contact and the reference electrode (positive electrode 10) is 0 V.

At time point t4, short-circuiting between one negative electrode 20 and one positive electrode 10 (short-circuiting between single layers) is considered to have occurred through needle-shaped member 2. It is considered that occurrence of short-circuiting through needle-shaped member 2 is detected based on variation (decrease in this example) in second potential difference ($\Delta V2$). An amount of variation in second potential difference ($\Delta V2$) is considered as not being dependent on a capacity of a power storage device.

A short-circuiting current flows through needle-shaped member 2 due to occurrence of short-circuiting between single layers. Needle-shaped member 2 is considered to generate heat owing to Joule heat. Positive electrode 10 in contact with needle-shaped member 2 which generates heat is molten to spread, and positive electrode 10 and needle-shaped member 2 may be disconnected from each other. This phenomenon is also denoted as "fusing" herein. At time point t5, positive electrode 10 and needle-shaped member 2 are disconnected from each other due to fusing. It is considered that, when positive electrode 10 and needle-shaped member 2 are disconnected from each other, the second potential difference ($\Delta V2$) changes its behavior from decrease to increase. It is considered that, since contact between needle-shaped member 2 and negative electrode 20 is maintained, the second potential difference ($\Delta V2$) increases up to a potential difference between the reference electrode (positive electrode 10) and negative electrode 20 at that time point.

The reason why the second potential difference ($\Delta V2$) is slightly smaller than the first potential difference ($\Delta V1$) at time point t5 may be because of decrease in potential difference between positive electrode 10 and negative electrode 20 due to short-circuiting between single layers before fusing.

It is considered that short-circuiting can be set to short-circuiting between single layers by having needle-shaped member 2 remain stopped during a period from time point t4 until time point t5. A state of the power storage device from time point t4 until time point t5 is considered as a state of the short-circuiting power storage device. The "state of the power storage device" represents, for example, an appearance of the power storage device, whether a temperature of the power storage device is high or low, or whether a voltage of the power storage device is high or low. In the method of evaluating a power storage device according to the present disclosure, it is considered that a state of the short-circuiting power storage device corresponds to a state of the power storage device when local internal short-circuiting occurs.

It is considered that short-circuiting between single layers for the second time can also be caused by subsequently inserting needle-shaped member 2 deeper. It is considered that the number of short-circuited layers can be counted by repeatedly causing short-circuiting between single layers. It is considered that, by counting the number of short-circuited layers, a target number of short-circuited layers can be realized. Namely, the method of evaluating a power storage device in the present disclosure is considered to be able to control the number of short-circuited layers.

When tubular member 1 and needle-shaped member 2 are integrally moved also after the tip end of needle-shaped member 2 comes in contact with negative electrode 20 in FIG. 1, short-circuiting through needle-shaped member 2 may be less likely to occur.

Another aspect in which no tubular member 1 is provided will be described as a reference.

FIG. 3 is a third conceptual diagram for illustrating the method of evaluating a power storage device according to the present disclosure.

Positive electrode 10 and housing 90 are electrically connected to each other also in FIG. 3 as in FIG. 1. Positive electrode 10 is adopted as the reference electrode also in FIG. 3 as in FIG. 1. At time point t1, needle-shaped member 2 is not yet in contact with housing 90. At time point t1, the second potential difference ($\Delta V2$) between positive electrode 10 (reference electrode) and needle-shaped member 2 is considered as being substantially 0 V.

As needle-shaped member 2 is inserted into the power storage device, needle-shaped member 2 comes in contact with housing 90 at time point t2. The second potential difference ($\Delta V2$) is considered as still remaining at 0 V also at time point t2. This may be because housing 90 is equal in potential to positive electrode 10.

Needle-shaped member 2 penetrates housing 90 and is inserted in stack portion 50. The tip end of needle-shaped member 2 comes in contact with negative electrode 20 at time point t3. Negative electrode 20 is an electrode different from the reference electrode (positive electrode 10).

It is considered, however, that the second potential difference ($\Delta V2$) still remains at 0 V or variation thereof is very small also at time point t3. This may be because of short-circuiting between positive electrode 10 and negative electrode 20 through needle-shaped member 2 and housing 90.

FIG. 4 is a fourth conceptual diagram for illustrating the method of evaluating a power storage device according to the present disclosure.

FIG. 4 conceptually shows a circuit at time point t3 in FIG. 3. Since insulating tubular member 1 (see FIG. 2) is not present in FIG. 4, a current path through needle-shaped member 2 and housing 90 is considered to be present. It is considered that voltage measurement device 502 is connected in parallel to the current path. Therefore, voltage measurement device 502 is not considered to detect a first potential difference ($\Delta V1$) between positive electrode 10 and negative electrode 20.

It is considered that contact between an electrode different from the reference electrode and the tip end of needle-shaped member 2 can be detected based on variation in second potential difference ($\Delta V2$) owing to separation by insulating tubular member 1 between needle-shaped member 2 and housing 90 (tubular member 1 electrically insulating needle-shaped member 2 and housing 90 from each other) as shown in FIGS. 1 and 2.

As needle-shaped member 2 is inserted deeper into stack portion 50 as shown in FIG. 3, needle-shaped member 2 penetrates negative electrode 20 and separator 30. The tip end of needle-shaped member 2 comes in contact with positive electrode 10 at time point t4. The second potential difference ($\Delta V2$) is considered to remain at 0 V.

As set forth above, when positive electrode 10 or negative electrode 20 is electrically connected to housing 90 and insulating tubular member 1 is not provided, it can be difficult to detect short-circuiting. In contrast, since evaluation jig 5 includes insulating tubular member 1 in the method of evaluating a power storage device according to the present disclosure, short-circuiting is considered as being detectable regardless of a state of electrical connection between housing 90 and an electrode.

When positive electrode 10 and negative electrode 20 are not electrically connected to housing 90, short-circuiting is considered as being detectable even though tubular member 1 is not provided. This may be because short-circuiting through needle-shaped member 2 and housing 90 does not occur.

[2] Short-circuiting through the needle-shaped member may be short-circuiting between one positive electrode and one negative electrode. It is considered that, according to the method of evaluating a power storage device in the present disclosure, short-circuiting between single layers can be caused as described previously.

[3] The needle-shaped member may cause short-circuiting between one positive electrode and one negative electrode a plurality of times. It is considered that, according to the method of evaluating a power storage device in the present disclosure, short-circuiting between single layers can also repeatedly be caused as described previously.

[4] An evaluation jig according to the present disclosure is the evaluation jig used in the method of evaluating a power storage device described in any one of [1] to [3]. As described previously, the evaluation jig includes the insulating tubular member and the conductive needle-shaped member. The needle-shaped member is inserted through the tubular member. The needle-shaped member is constructed to be movable independently of the tubular member. A ratio of a diameter of the needle-shaped member to an outer diameter of the tubular member is not higher than 60% in a cross-section orthogonal to an axial direction of the evaluation jig.

When a ratio of a diameter of needle-shaped member 2 to an outer diameter of tubular member 1 exceeds 60%, it may be difficult to perform an operation to insert evaluation jig 5 into the power storage device such that a portion other than the tip end of needle-shaped member 2 and housing 90 are separated from each other by tubular member 1 as described in [1]. This may be because tubular member 1 may be chipped when evaluation jig 5 penetrates housing 90.

In the method of evaluating a power storage device in [1], so long as an operation to insert evaluation jig 5 into the power storage device such that the portion other than the tip end of needle-shaped member 2 and housing 90 are separated from each other by tubular member 1, a ratio of a diameter of needle-shaped member 2 to an outer diameter of tubular member 1 should not be limited to 60% or lower.

[5] A method of manufacturing a power storage device according to the present disclosure includes at least (i) and (j) below.

(i) A plurality of power storage devices are manufactured.

(j) One or more of the plurality of power storage devices are evaluated with the method of evaluating a power storage device described in any one of [1] to [3].

The method of evaluating a power storage device according to the present disclosure may be used, for example, for a sampling inspection during manufacturing. The method of evaluating a power storage device according to the present disclosure may be used, for example, for reviewing specifications during development. According to the method of manufacturing a power storage device in the present disclosure, manufacturing of power storage devices which can exhibit prescribed capability on the occurrence of internal short-circuiting is expected.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
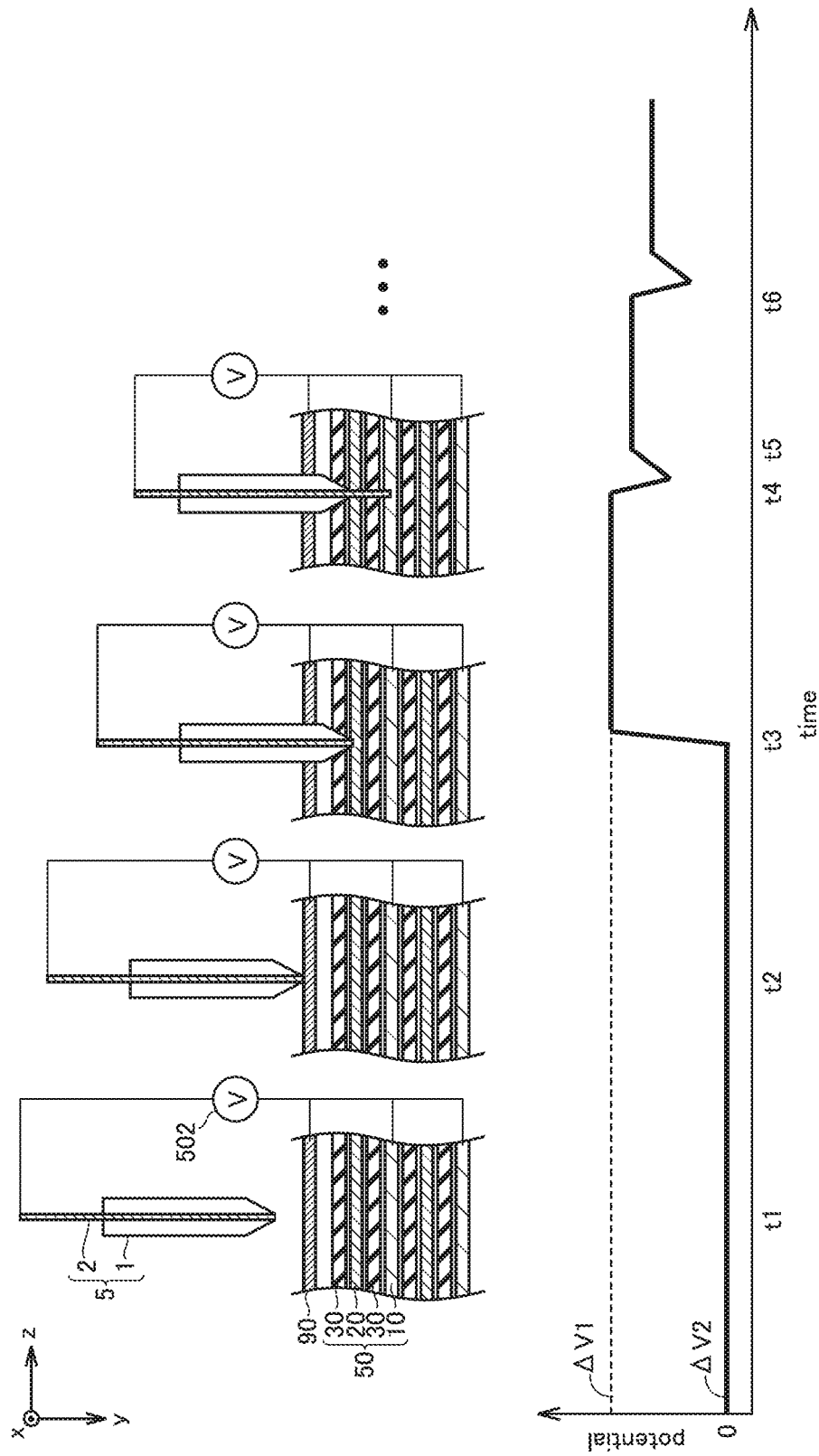
FIG. 1 is a first conceptual diagram for illustrating a method of evaluating a power storage device according to the present disclosure.

An embodiment of the present disclosure (which is herein also denoted as the "present embodiment") will be described below. The description below, however, does not limit the scope of claims. Drawings are referred to as appropriate in the description. In the drawings herein, dimensional relation is modified as appropriate for the sake of convenience of description. Dimensional relation expressed in the drawings herein does not represent actual dimensional relation.

<Method of Evaluating Power Storage Device>

Figure 5:
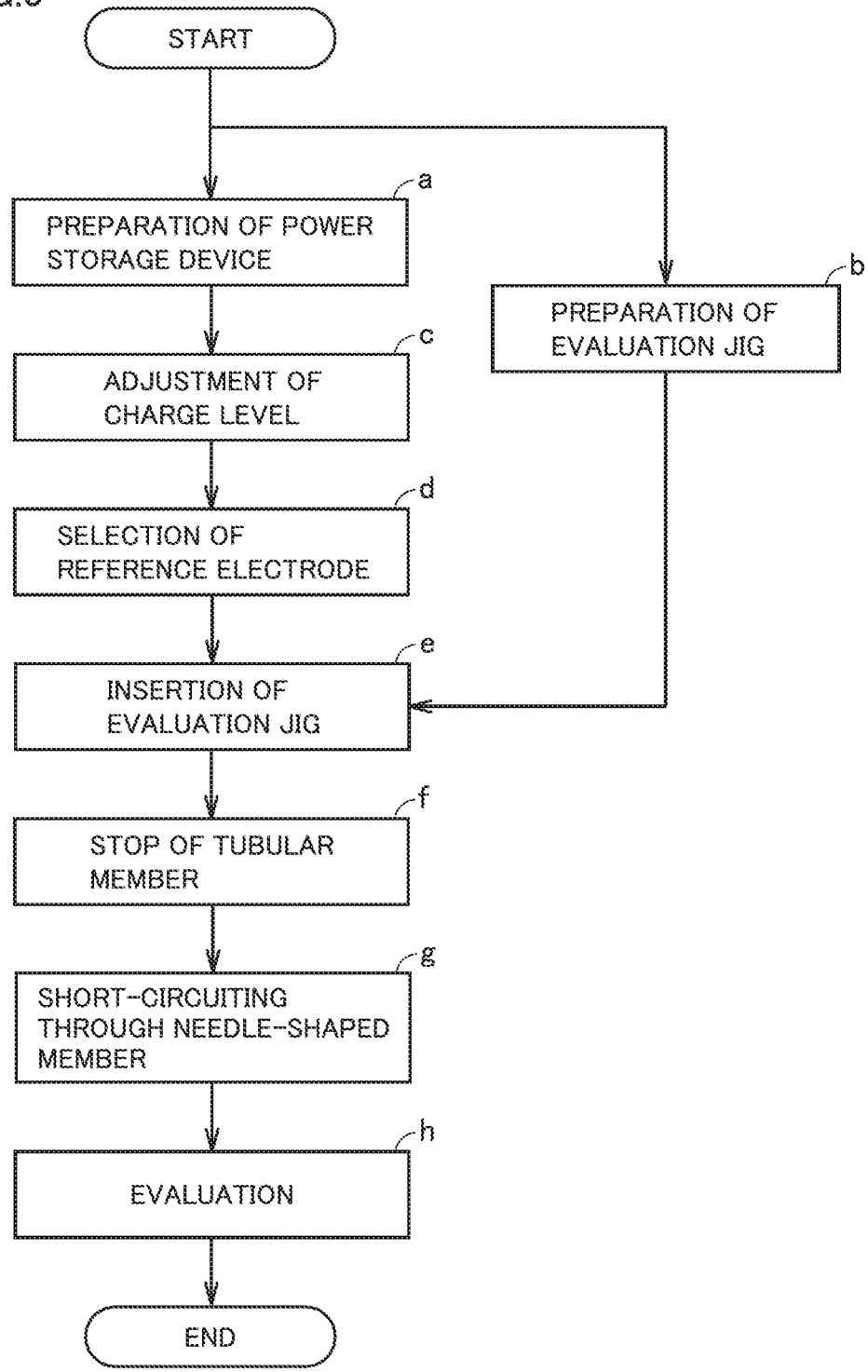
FIG. 5 is a flowchart showing overview of the method of evaluating a power storage device according to the present embodiment.

FIG. 5 is a flowchart showing overview of a method of evaluating a power storage device according to the present embodiment.

The method of evaluating a power storage device in the present embodiment includes at least "(a) preparation of power storage device," "(b) preparation of evaluation jig," "(c) adjustment of charge level," "(d) selection of reference electrode," "(e) insertion of evaluation jig," "(f) stop of tubular member," "(g) short-circuiting through needle-shaped member," and "(h) evaluation."

<<(a) Preparation of Power Storage Device>>

The method of evaluating a power storage device in the present embodiment includes preparing a power storage device. In the present embodiment, a single power storage device may be prepared. A plurality of power storage devices may be prepared.

The power storage device should not particularly be limited. The power storage device may be a secondary battery (a rechargeable battery). The power storage device may be a primary battery. The power storage device may be a capacitor. The power storage device may be, for example, a lead acid battery, a nickel-cadmium battery, a nickel metal hydride battery, a lithium ion battery, a sodium ion battery, a lithium primary battery, an electric double layer capacitor, or a lithium ion capacitor.

A shape and a type of a housing (an exterior) should not particularly be limited either. The power storage device may be, for example, a prismatic battery, a cylindrical battery, or a laminate-type battery. The "prismatic" shape represents a parallelepiped shape. The "laminate type" may also be referred to as a pouch type. Overview of the prismatic battery, the cylindrical battery, and the laminate-type battery will be described here.

(Prismatic Battery)

Figure 6:
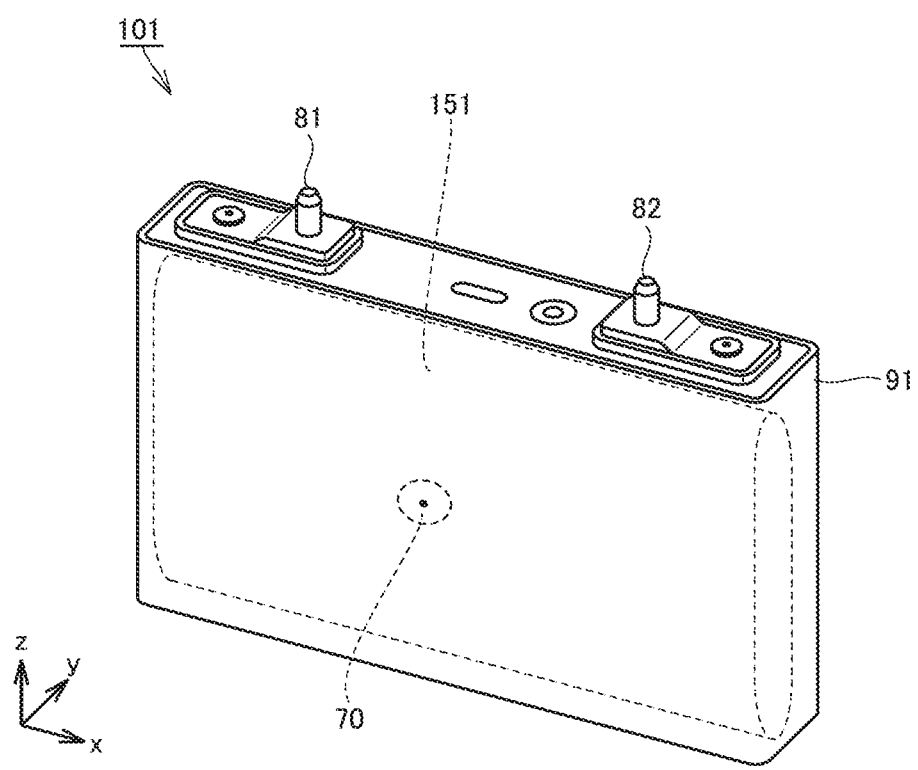
FIG. 6 is a schematic diagram showing one example of a construction of a prismatic battery.

FIG. 6 is a schematic diagram showing one example of a construction of a prismatic battery.

A first power storage device 101 is a prismatic battery. First power storage device 101 includes at least a first housing 91 and a first electrode assembly 151. An outer profile of first housing 91 is in a parallelepiped shape. First housing 91 is formed, for example, of aluminum (Al), an aluminum alloy, stainless steel (SUS), iron (Fe), or a resin. First housing 91 includes a positive electrode terminal 81 and a negative electrode terminal 82. First housing 91 may include, for example, a liquid introduction port, a gas exhaust valve, and a current interrupt device (CID).

First electrode assembly 151 is accommodated in first housing 91. The electrode assembly may also be referred to as an "electrode group" or an "electrode set" or an "electrode body." An electrolyte is also accommodated in first housing 91. First electrode assembly 151 may be of a wound type. First electrode assembly 151 may be of a stack (layered) type.

Figure 7:
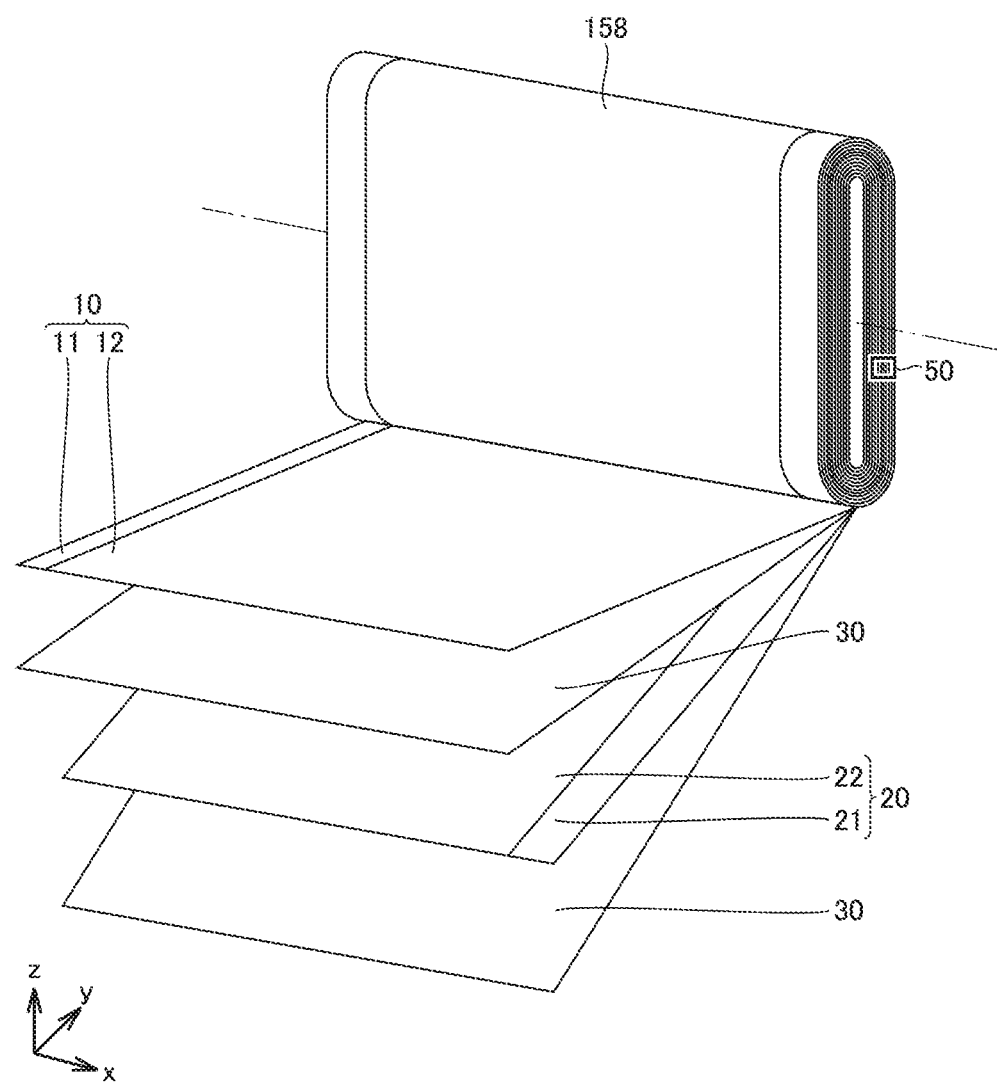
FIG. 7 is a schematic diagram showing an electrode assembly of a wound type.

FIG. 7 is a schematic diagram showing an electrode assembly of a wound type.

First electrode assembly 151 may be a wound electrode assembly 158. Wound electrode assembly 158 includes positive electrode 10, negative electrode 20, and separator 30. Wound electrode assembly 158 is formed by stacking positive electrode 10, separator 30, negative electrode 20, and separator 30 in this order and spirally winding the same. Stack portion 50 is formed in wound electrode assembly 158 by alternately stacking at least one positive electrode 10 and at least one negative electrode 20 (see, for example, FIG. 1).

Wound electrode assembly 158 may be wound to have a flat profile. Wound electrode assembly 158 may be wound cylindrically and thereafter formed to have a flat profile. Wound electrode assembly 158 may be wrapped, for example, with a wrapping material made of a resin.

Figure 8:
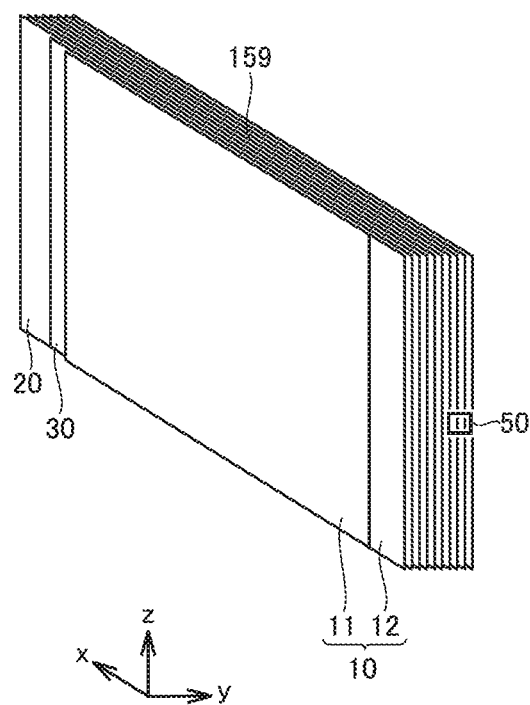
FIG. 8 is a schematic diagram showing an electrode assembly of a stack type.

FIG. 8 is a schematic diagram showing an electrode assembly of a stack type.

First electrode assembly 151 may be a stacked electrode assembly 159. Stacked electrode assembly 159 is formed by alternately stacking positive electrode 10 and negative electrode 20. Stack portion 50 is formed also in stacked electrode assembly 159 by alternately stacking at least one positive electrode 10 and at least one negative electrode 20 (see, for example, FIG. 1). Separator 30 is arranged between positive electrode 10 and negative electrode 20.

Positive electrode 10 is electrically connected to positive electrode terminal 81 (see, for example, FIGS. 6 and 7). Positive electrode 10 is in a form of a sheet. Positive electrode 10 may include, for example, a positive electrode current collector 11 and a positive electrode active material portion 12 (see, for example, FIG. 7). Positive electrode active material portion 12 is formed, for example, by applying a positive electrode composite material containing a positive electrode active material to a surface of positive electrode current collector 11. Positive electrode active material portion 12 may be formed on both of front and rear surfaces of positive electrode current collector 11. The positive electrode composite material may further contain a conductive material and a binder in addition to the positive electrode active material.

In a lithium ion battery, positive electrode current collector 11 may be, for example, an aluminum foil. The positive electrode active material may be, for example, a lithium-containing transition metal oxide. The conductive material may be, for example, carbon black. The binder may be, for example, polyvinylidene difluoride (PVdF).

Negative electrode 20 is electrically connected to negative electrode terminal 82 (see, for example, FIGS. 6 and 7). Negative electrode 20 is in a form of a sheet. Negative electrode 20 may include, for example, a negative electrode current collector 21 and a negative electrode active material portion 22 (see FIG. 7). Negative electrode active material portion 22 may be formed on a surface of negative electrode current collector 21. Negative electrode active material portion 22 is formed, for example, by applying a negative electrode composite material containing a negative electrode active material to a surface of negative electrode current collector 21. Negative electrode active material portion 22 may be formed on both of front and rear surfaces of negative electrode current collector 21. The negative electrode composite material may further contain a binder in addition to the negative electrode active material.

In a lithium ion battery, negative electrode current collector 21 may be, for example, a copper (Cu) foil. The negative electrode active material may be, for example, graphite, silicon, silicon oxide, or lithium metal. The binder may be, for example, carboxymethyl cellulose (CMC) and styrene-butadiene rubber (SBR).

Separator 30 may be, for example, a porous film made of a resin (see, for example, FIG. 7). Separator 30 may have a multi-layered structure. For example, separator 30 may be formed by stacking a porous film composed of polypropylene (PP), a porous film composed of polyethylene (PE), and a porous film composed of polypropylene in this order.

The electrolyte may be a liquid electrolyte. The liquid electrolyte may be an electrolyte solution. The liquid electrolyte may be an ionic liquid. The electrolyte may be a gel electrolyte (a polymer electrolyte). The electrolyte may be a solid electrolyte. Namely, first power storage device 101 may be an all-solid-state battery. The all-solid-state battery may not include separator 30.

It may be difficult to conduct a forced internal short circuit test for the all-solid-state battery, because once first electrode assembly 151 is disassembled in order to insert a small nickel piece, it is difficult to return arrangement of electrodes to the original state. Since the method of evaluating a power storage device in the present embodiment does not require disassembly of the power storage device, it is considered that the all-solid-state battery can also be evaluated therewith.

(Cylindrical Battery)

Figure 9:
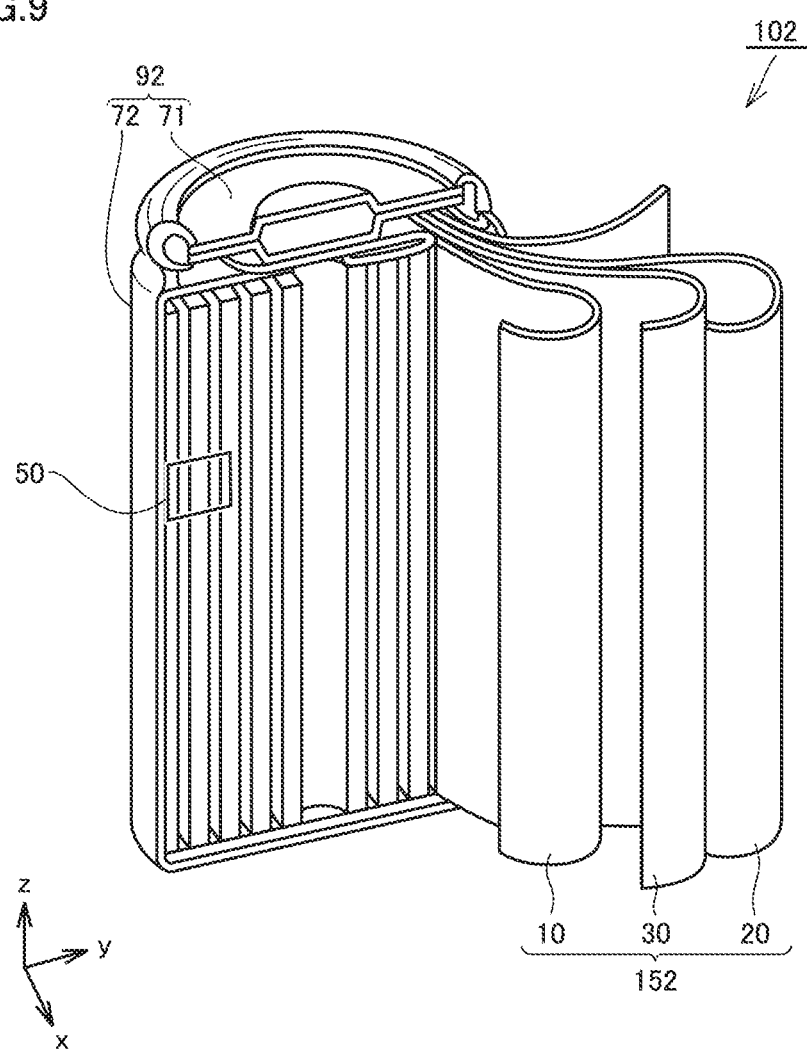
FIG. 9 is a schematic diagram showing one example of a construction of a cylindrical battery.

FIG. 9 is a schematic diagram showing one example of a construction of a cylindrical battery.

A second power storage device 102 is a cylindrical battery. Second power storage device 102 includes a second housing 92 and a second electrode assembly 152. An outer profile of second housing 92 is cylindrical. Second housing 92 is formed, for example, of stainless steel, iron, or a resin. Second housing 92 includes a cap 71 and a can 72. Cap 71 may electrically be connected to positive electrode 10 or negative electrode 20. Namely, cap 71 may function as a terminal of positive electrode 10 or negative electrode 20. Can 72 may electrically be connected to positive electrode 10 or negative electrode 20. Namely, can 72 may function as a terminal of positive electrode 10 or negative electrode 20.

Second electrode assembly 152 is accommodated in second housing 92. The electrolyte is also accommodated in second housing 92. Second electrode assembly 152 is of the wound type. Second electrode assembly 152 includes positive electrode 10, negative electrode 20, and separator 30. Second electrode assembly 152 is formed by stacking positive electrode 10, separator 30, negative electrode 20, and separator 30 in this order and spirally winding the same. Stack portion 50 is formed also in second electrode assembly 152 by alternately stacking at least one positive electrode 10 and at least one negative electrode 20 (see, for example, FIG. 1).

(Laminate-Type Battery)

Figure 10:
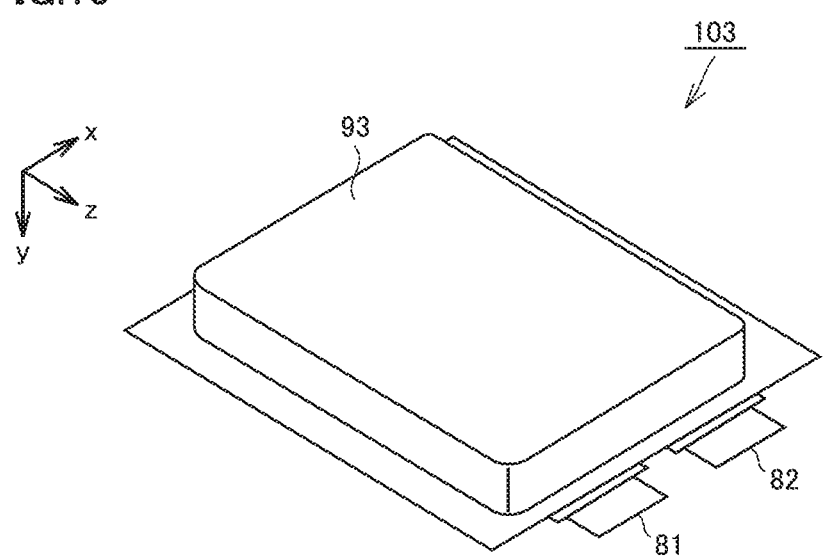
FIG. 10 is a first schematic diagram showing one example of a construction of a laminate-type battery.
Figure 11:
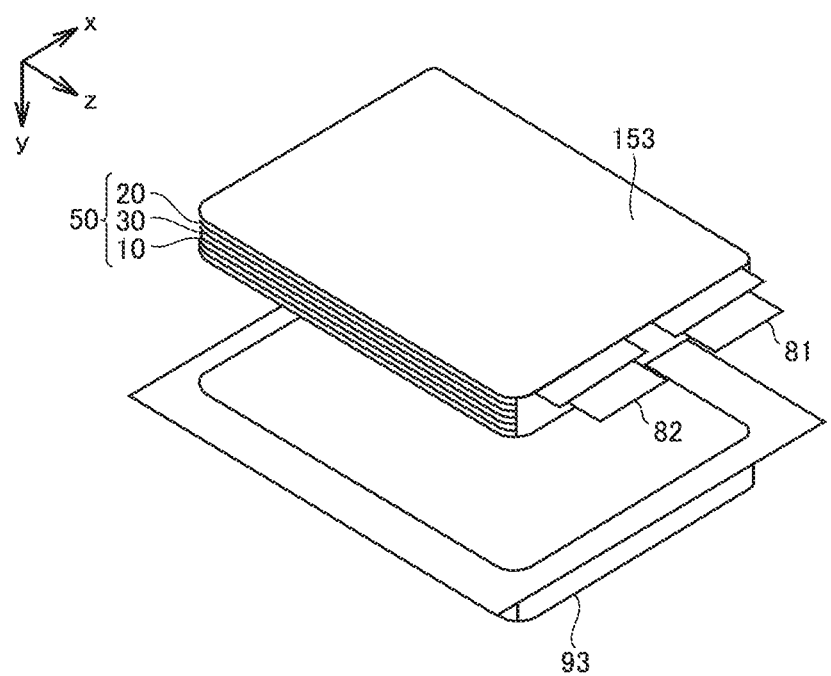
FIG. 11 is a second schematic diagram showing one example of a construction of a laminate-type battery.

FIG. 10 is a first schematic diagram showing one example of a construction of a laminate-type battery. FIG. 11 is a second schematic diagram showing one example of a construction of a laminate-type battery.

A third power storage device 103 is a laminate-type battery. Third power storage device 103 includes at least a third housing 93 and a third electrode assembly 153 (see FIGS. 10 and 11). An outer profile of third housing 93 has a flat shape. Third housing 93 is made of an aluminum laminate enclosure material. The aluminum laminate enclosure material is formed by stacking a resin film, an aluminum foil, and a resin film in this order. Positive electrode terminal 81 (a positive electrode tab) and negative electrode terminal 82 (a negative electrode tab) allow communication between the inside and the outside of third housing 93.

Third electrode assembly 153 is accommodated in third housing 93. The electrolyte is also accommodated in third housing 93. Third electrode assembly 153 is of the stack type. Third electrode assembly 153 is formed by alternately stacking positive electrode 10 and negative electrode 20. Namely, stack portion 50 is formed also in third electrode assembly 153 by alternately stacking at least one positive electrode 10 and at least one negative electrode 20 (see, for example, FIG. 1). Separator 30 is arranged between positive electrode 10 and negative electrode 20. Third electrode assembly 153 may be of the wound type.

First power storage device 101 (prismatic battery), second power storage device 102 (cylindrical battery), and third power storage device 103 (laminate-type battery) each include at least the housing and the electrode assembly as set forth above. The electrode assembly is accommodated in housing 90 as shown in FIG. 1. The electrode assembly includes positive electrode 10 and negative electrode 20. Stack portion 50 is formed in the electrode assembly by alternately stacking at least one positive electrode 10 and at least one negative electrode 20. So long as these features are included, a power storage device different in shape and type from the prismatic battery, the cylindrical battery, and the laminate-type battery may be prepared.

An application mainly to the prismatic battery (first power storage device 101) will be described below for the sake of convenience. The method of evaluating a power storage device in the present embodiment can naturally be applied also to the cylindrical battery and the laminate-type battery.

<<(b) Preparation of Evaluation Jig>>

The method of evaluating a power storage device in the present embodiment includes preparation of evaluation jig 5.

Figure 12:
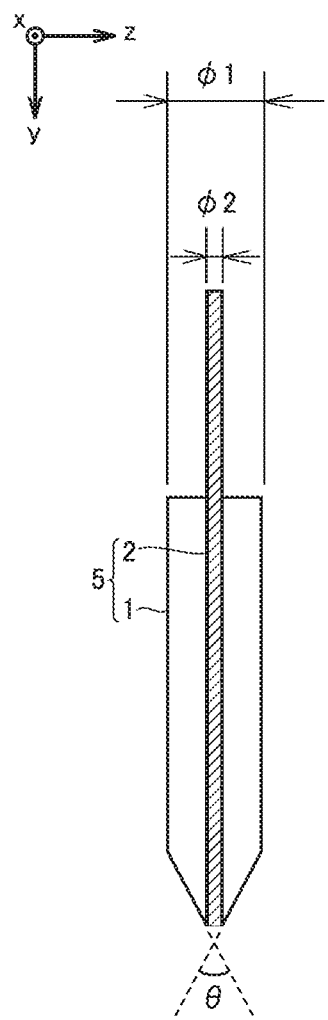
FIG. 12 is a conceptual cross-sectional view showing one example of an evaluation jig according to the present embodiment.

FIG. 12 is a conceptual cross-sectional view showing one example of the evaluation jig in the present embodiment.

Evaluation jig 5 includes insulating tubular member 1 and conductive needle-shaped member 2. Needle-shaped member 2 is inserted through tubular member 1. Needle-shaped member 2 is constructed to be movable independently of tubular member 1.

FIG. 12 shows a cross-section in parallel to the axial direction of evaluation jig 5 (a yz plane). In a cross-section orthogonal to the axial direction of evaluation jig 5 (an xz plane), a ratio ($\phi 2/\phi 1$) of a diameter ($\phi 2$) of needle-shaped member 2 to an outer diameter ($\phi 1$) of tubular member 1 is not higher than 60%. Chipping of tubular member 1 is thus considered as being less likely when evaluation jig 5 penetrates first housing 91. So long as an operation to insert evaluation jig 5 into first power storage device 101 such that a portion other than the tip end of needle-shaped member 2 and first housing 91 are separated from each other by tubular member 1 can be performed, the ratio ($\phi 2/\phi 1$) may exceed 60%.

(Tubular Member)

Tubular member 1 has at least a length exceeding a wall thickness (a thickness) of first housing 91. A "length" means a total length in the axial direction. Tubular member 1 may have a length, for example, not shorter than 10 mm and not longer than 200 mm. Tubular member 1 may have a length, for example, not shorter than 10 mm and not longer than 150 mm. Tubular member 1 may have a length, for example, not shorter than 10 mm and not longer than 50 mm.

Tubular member 1 is insulating. "Being insulating" means being formed of a material of a resistivity not lower than $10^3$ Ω·m within a temperature range not lower than 0° C. and not higher than 25° C. A value in a literature such as "Kagaku Binran (Edited by The Chemical Society of Japan and published by Maruzen Publishing, Co., Ltd.)" may be used as a resistivity of a material.

A material for tubular member 1 is selected as appropriate, for example, depending on a material property or a hardness of first housing 91. For example, when first housing 91 is made of a metal, a material hard to some extent is desirably selected. Tubular member 1 may be formed, for example, of a ceramic material. The ceramic material may be, for example, alumina, boehmite, mullite, zirconia, or magnesia. One type of ceramic material may be used alone. Two or more types of ceramic materials may be used as being combined.

Tubular member 1 includes a through hole. The through hole penetrates tubular member 1 in the axial direction of tubular member 1. Needle-shaped member 2 is inserted through the through hole. Tubular member 1 may be, for example, cylindrical.

In the cross-section orthogonal to the axial direction of evaluation jig 5, a shape of tubular member 1 and a shape of the through hole should not particularly be limited. The shape of tubular member 1 and the shape of the through hole in the cross-section may be, for example, circular, square, or hexagonal.

Tubular member 1 may have an outer diameter 1), for example, not smaller than 0.5 mm and not greater than 10 mm. Tubular member 1 may have an outer diameter ($\phi$1), for example, not smaller than 0.5 mm and not greater than 5 mm. Tubular member 1 may have an outer diameter ($\phi$1), for example, not smaller than 1 mm and not greater than 3 mm. When the shape of tubular member 1 is not circular in the cross-section orthogonal to the axial direction of evaluation jig 5, a maximum width thereof is defined as the outer diameter ($\phi$1) of tubular member 1.

Tubular member 1 may have a wall thickness (a thickness), for example, not smaller than 0.2 mm and not greater than 1.25 mm. Tubular member 1 may have a wall thickness (a thickness), for example, not smaller than 0.2 mm and not greater than 0.6 mm.

Tubular member 1 may include a pointed tip end. With tubular member 1 including a pointed tip end, evaluation jig 5 is expected to more easily pass through housing 90. An angle at the tip end ($\theta$1) may be, for example, not smaller than ten degrees and not greater than ninety degrees. An angle at the tip end ($\theta$1) may be, for example, not smaller than twenty degrees and not greater than ninety degrees. An angle at the tip end ($\theta$1) may be, for example, not smaller than twenty degrees and not greater than forty-five degrees. An angle at the tip end ($\theta$1) may be, for example, not smaller than forty-five degrees and not greater than ninety degrees.

Tubular member 1 may be tapered as a whole. An area of tubular member 1 extending by a certain extent from its extreme end may be tapered. For example, an area to a position distant from the extreme end by not smaller than 0.5 mm and not greater than 100 mm may be tapered. For example, an area to a position distant from the extreme end by not smaller than 0.5 mm and not greater than 60 mm may be tapered. When tubular member 1 is tapered, an outer diameter ($\phi$1) of tubular member 1 described previously is measured at a position where the outer diameter ($\phi$1) is largest.

(Needle-Shaped Member)

Needle-shaped member 2 is inserted through tubular member 1. Needle-shaped member 2 is constructed to be movable independently of tubular member 1. A clearance may be provided between tubular member 1 and needle-shaped member 2. The clearance may be, for example, not smaller than 0.01 mm and not greater than 1 mm. So long as needle-shaped member 2 is movable independently of tubular member 1, the clearance may be set to substantially 0 (zero).

Needle-shaped member 2 has at least a length exceeding a total thickness of positive electrode 10, negative electrode 20, and separator 30. A length of needle-shaped member 2 can be selected as appropriate in accordance with a target number of short-circuited layers. Needle-shaped member 2 may be longer than tubular member 1. Needle-shaped member 2 may be shorter than tubular member 1. It is considered that, with needle-shaped member 2 being longer than tubular member 1, control of movement of needle-shaped member 2 may be facilitated. Needle-shaped member 2 may have a length, for example, not shorter than 10 mm and not longer than 200 mm. Needle-shaped member 2 may have a length, for example, not shorter than 10 mm and not longer than 150 mm. Needle-shaped member 2 may have a length, for example, not shorter than 10 mm and not longer than 50 mm.

Needle-shaped member 2 is conductive. "Being conductive" means being formed of a material of a resistivity not higher than $10^{-3}$ $\Omega \cdot$m within a temperature range not lower than 0° C. and not higher than 25° C. A value in a literature such as "Kagaku Binran (Edited by The Chemical Society of Japan and published by Maruzen Publishing, Co., Ltd.)" may be used as a resistivity of a material.

Needle-shaped member 2 may be made, for example, of a metal. Needle-shaped member 2 may be made, for example, of iron. A shape of needle-shaped member 2 should not particularly be limited in the cross-section orthogonal to the axial direction of evaluation jig 5. A shape of needle-shaped member 2 in the cross-section may be, for example, circular, square, or hexagonal.

Needle-shaped member 2 may have a diameter ($\phi$2), for example, not smaller than 0.5 mm and not greater than 5 mm. Needle-shaped member 2 may have a diameter ($\phi$2), for example, not smaller than 0.5 mm and not greater than 1.8 mm. Needle-shaped member 2 may have a diameter ($\phi$2), for example, not smaller than 0.6 mm and not greater than 1.8 mm. When the shape of needle-shaped member 2 is not circular in the cross-section orthogonal to the axial direction of evaluation jig 5, a maximum width thereof is defined as the diameter ($\phi$2) of needle-shaped member 2.

A ratio ($\phi$2/$\phi$1) of a diameter ($\phi$2) of needle-shaped member 2 to an outer diameter ($\theta$1) of tubular member 1 is not higher than 60% in the cross-section orthogonal to the axial direction of evaluation jig 5. The lower limit of the ratio ($\phi$2/$\phi$1) should not particularly be limited. The ratio ($\phi$2/$\phi$1) may be, for example, not lower than 17%. When a result of calculation of the ratio ($\phi$2/$\phi$1) has a decimal fraction, the result is rounded off to the closest whole number.

The tip end of needle-shaped member 2 may be tapered or may not be tapered. When needle-shaped member 2 is tapered in the cross-section in parallel to the axial direction of evaluation jig 5, a maximum width thereof is defined as the outer diameter ($\phi$1) of needle-shaped member 2.

<<(c) Adjustment of Charge Level>>

The method of evaluating a power storage device in the present embodiment includes adjusting a charge level of first power storage device 101 to produce a first potential difference ($\Delta$V1) between positive electrode 10 and negative electrode 20.

The "charge level" refers to a ratio calculated by excluding a ratio of an amount of electricity discharged from a fully charged state of first power storage device 101. For the primary battery, an unused state is regarded as 100% charge level for the sake of convenience. The charge level is also referred to as a "charging rate" or a "state of charge (SOC)."

The charge level can be adjusted by a general charging and discharging apparatus. The charge level may be adjusted by charging alone. The charge level may be adjusted by discharging alone. The charge level may be adjusted by combination of charging and discharging.

The charge level may be adjusted, for example, to 100%. A condition for short-circuiting may be adjusted based on the charge level. For example, the condition is considered as being severer as the charge level is higher. The charge level may be adjusted, for example, to a level exceeding 100%. The charge level may be adjusted, for example, to a charge level exceeding 0% and lower than 100%. The charge level may be adjusted, for example, to a level not lower than 80% and not higher than 120%.

The charge level can be adjusted in a prescribed temperature environment. The charge level may be adjusted in a temperature environment, for example, not lower than 10° C. and not higher than 40° C. The charge level may be adjusted in a temperature environment, for example, not lower than 40° C. and not higher than 60° C. A prescribed leaving time may be set between adjustment of the charge level and insertion of evaluation jig 5. The leaving time may be set, for example, to a time period not shorter than thirty minutes and not longer than five hours. The leaving time may be set, for example, to a time period not shorter than one hour and not longer than three hours.

<<(d) Selection of Reference Electrode>>

The method of evaluating a power storage device in the present embodiment includes selection of positive electrode 10 or negative electrode 20 as the reference electrode. Positive electrode 10 may be selected as the reference electrode. Negative electrode 20 may be selected as the reference electrode. It is expected that variation (at least one of increase and decrease) in second potential difference ($\Delta V2$) increases when positive electrode 10 is selected as the reference electrode, although a detailed mechanism is unclear. Large variation in second potential difference ($\Delta V2$) is expected to facilitate detection of short-circuiting or the like.

<<(e) Insertion of Evaluation Jig>>

The method of evaluating a power storage device in the present embodiment includes performing an operation to insert evaluation jig 5 into first power storage device 101 such that a portion of needle-shaped member 2 other than the tip end and first housing 91 are separated from each other by tubular member 1.

In the present embodiment, the tip end of needle-shaped member 2 refers, for example, to the extreme end of needle-shaped member 2 and an area extending to a position distant by 5 mm from the extreme end in the axial direction of needle-shaped member 2. The tip end of needle-shaped member 2 may refer, for example, to the extreme end of needle-shaped member 2 and an area extending to a position distant by 1 mm from the extreme end in the axial direction of needle-shaped member 2. The tip end of needle-shaped member 2 may refer, for example, to the extreme end of needle-shaped member 2 and an area extending to a position distant by 0.5 mm from the extreme end in the axial direction of needle-shaped member 2. The tip end of needle-shaped member 2 may refer, for example to the extreme end of needle-shaped member 2 and an area extending to a position distant by 0.1 mm from the extreme end in the axial direction of needle-shaped member 2.

It is considered that, as a portion other than the tip end of needle-shaped member 2 and first housing 91 are separated from each other by tubular member 1, occurrence of short-circuiting through needle-shaped member 2 and first housing 91 is suppressed. It is thus considered that short-circuiting between single layers can occur and is detectable regardless of a state of electrical connection between first housing 91 and an electrode.

In the present embodiment, evaluation jig 5 may be inserted after a temperature of first power storage device 101 is kept within a prescribed temperature range. A temperature of first power storage device 101 may be kept within a temperature range, for example, not lower than 10° C. and not higher than 50° C. For example, "being kept at 40° C." means that first power storage device 101 is left in a thermostatic chamber set at 40° C. for a period not shorter than thirty minutes and not longer than one hour.

(Measurement of Second Potential Difference)

The second potential difference ($\Delta V2$) is a potential difference between the reference electrode and needle-shaped member 2. In the present embodiment, contact between an electrode different from the reference electrode and the tip end of needle-shaped member 2 is detected based on variation (increase or decrease) in second potential difference ($\Delta V2$). Furthermore, occurrence of short-circuiting (typically, short-circuiting between single layers) is detected based on variation in second potential difference ($\Delta V2$).

Figure 13:
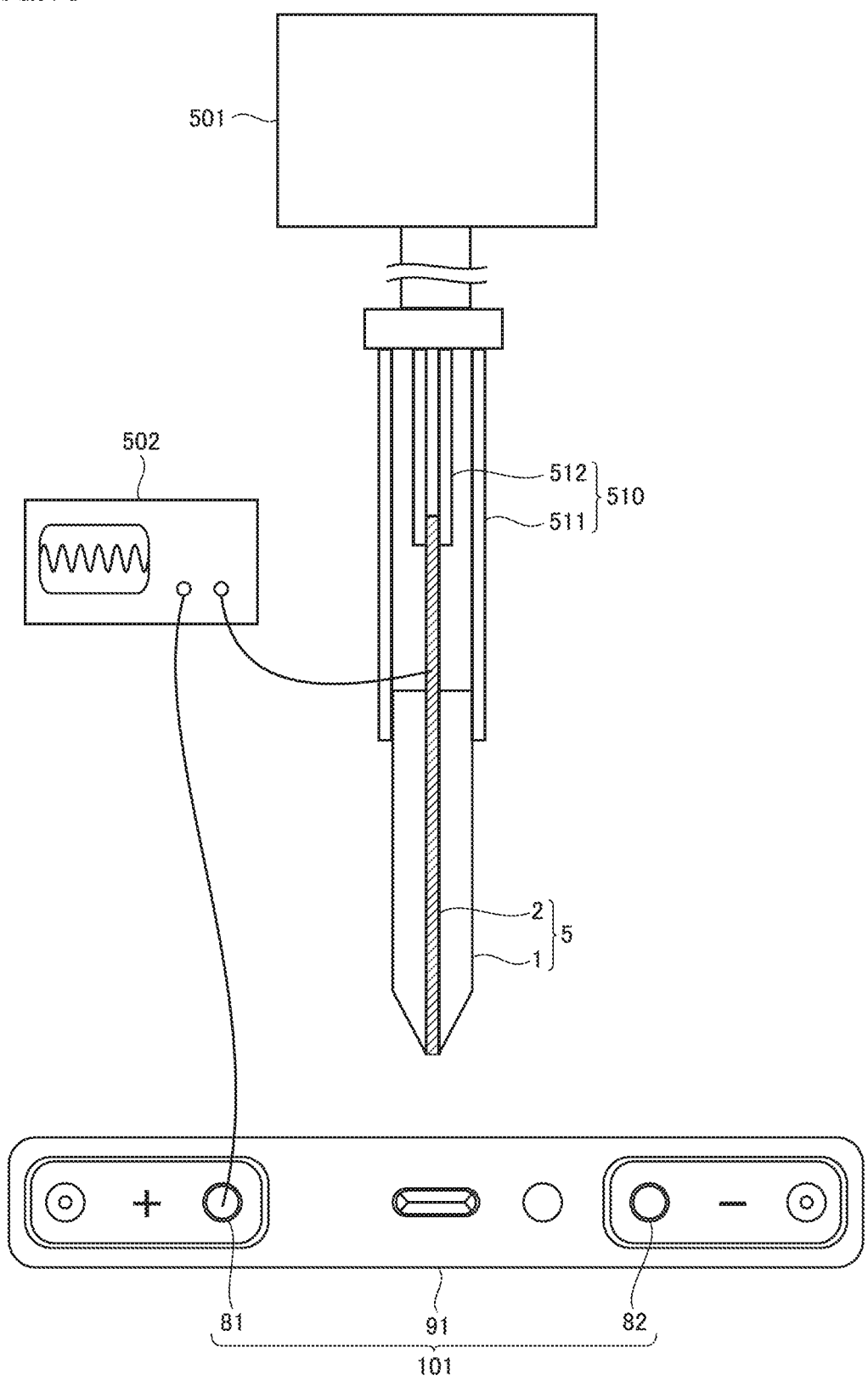
FIG. 13 is a schematic diagram showing one example of a method of measuring a second potential difference.

FIG. 13 is a schematic diagram showing one example of a method of measuring a second potential difference.

The second potential difference ($\Delta V2$) can be measured with voltage measurement device 502. Voltage measurement device 502 may be a general voltmeter. Voltage measurement device 502 may have a function, for example, to record transition of a voltage. Voltage measurement device 502 may be, for example, a data logger. Voltage measurement device 502 may further perform, for example, a temperature measurement function, a current measurement function, and a function to show transition of a voltage.

An electrode terminal selected as the reference electrode and needle-shaped member 2 are connected to respective measurement terminals of voltage measurement device 502. For example, when positive electrode 10 is selected as the reference electrode, positive electrode terminal 81 is connected to voltage measurement device 502. A prescribed lead can be used for connection. FIG. 13 shows an example in which positive electrode 10 is selected as the reference electrode. When negative electrode 20 is selected as the reference electrode, negative electrode terminal 82 is connected to voltage measurement device 502.

So long as variation in second potential difference ($\Delta V2$) is detectable, the tip end of needle-shaped member 2 may protrude from tubular member 1. So long as variation in second potential difference ($\Delta V2$) is detectable, needle-shaped member 2 and tubular member 1 may be flush with each other. So long as variation in second potential difference ($\Delta V2$) is detectable, the tip end of needle-shaped member 2 may be buried in tubular member 1.

(Control of Insertion Operation)

An operation to insert evaluation jig 5 is performed by a drive device 501. Drive device 501 may be, for example, a nail penetration test apparatus or a crash test apparatus. Drive device 501 includes, for example, a servo motor. Drive device 501 includes an attachment portion 510 for evaluation jig 5. For example, drive device 501 moves attachment portion 510 in one prescribed direction (for example, a vertical direction).

Attachment portion 510 may be constructed such that needle-shaped member 2 is movable independently of tubular member 1. For example, attachment portion 510 may include a first attachment portion 511 and a second attachment portion 512. Tubular member 1 is attached to first attachment portion 511. Needle-shaped member 2 is attached to second attachment portion 512. For example, as first attachment portion 511 releases tubular member 1, tubular member 1 can stop. As needle-shaped member 2 remains attached to second attachment portion 512 after tubular member 1 is released, needle-shaped member 2 is movable independently of tubular member 1.

(Direction of Insertion)

Evaluation jig 5 is inserted into first power storage device 101 along the direction of stack of positive electrode 10 and negative electrode 20 (the direction of the y axis in FIG. 1). The direction of insertion of evaluation jig 5 is desirably substantially identical to the direction of stack of positive electrode 10 and negative electrode 20. When evaluation jig 5 is inserted into stack portion 50, an angle formed between the direction of stack of positive electrode 10 and negative electrode 20 and the axial direction of evaluation jig 5 may be, for example, not smaller than zero degree and not greater than thirty degrees.

When first electrode assembly 151 is wound electrode assembly 158, a direction orthogonal to a surface greatest in area of outer surfaces of first power storage device 101 (the direction of the y axis in FIGS. 6 and 7) is desirably selected as the direction of insertion. A direction of a z axis in FIG. 6 may be selected as the direction of insertion. When first electrode assembly 151 is stacked electrode assembly 159, the direction of the y axis in FIGS. 6 and 8 is regarded as the direction of stack.

(Position of Insertion)

A position of insertion of evaluation jig 5 is set, for example, around the center of first electrode assembly 151 (see FIG. 6). The center represents the geometric center in a plane orthogonal to the direction of stack of positive electrode 10 and negative electrode 20 (for example, the xz plane in FIG. 6). For example, evaluation jig 5 may be inserted in a circular region 70 having a prescribed radius of which geometric center is defined as a central point. The radius of circular region 70 may be varied as appropriate depending on a size of first electrode assembly 151.

(Rate of Insertion)

A rate of insertion may be set, for example, such that a distance of travel of tubular member 1 or needle-shaped member 2 from detection of variation (increase or decrease) in second potential difference ($\Delta V2$) until stop of tubular member 1 or needle-shaped member 2 is smaller than a thickness of positive electrode 10 or negative electrode 20. Improvement, for example, in accuracy in control of the number of short-circuited layers is thus expected.

The rate of insertion may be, for example, not higher than 10 mm/second. The rate of insertion may be, for example, not higher than 1 mm/second. The rate of insertion may be, for example, not higher than 0.1 mm/second. The rate of insertion may be, for example, not higher than 0.01 mm/second. The rate of insertion may be, for example, not lower than 0.001 mm/second. The rate of insertion may be, for example, not lower than 0.001 mm/second and not higher than 0.1 mm/second.

<<(f) Stop of Tubular Member>>

The method of evaluating a power storage device in the present embodiment includes controlling an insertion operation to stop tubular member 1 when the tip end of needle-shaped member 2 comes in contact with an electrode different from the reference electrode in stack portion 50. Evaluation jig 5 as a whole may be stopped once. Only tubular member 1 may be stopped. The insertion operation may be controlled to stop tubular member 1 when the tip end of needle-shaped member 2 comes in contact first with an electrode different from the reference electrode. The insertion operation may be controlled to stop evaluation jig 5 when contact is established for the second time or later.

Contact between an electrode different from the reference electrode and the tip end of needle-shaped member 2 is detected based on variation in second potential difference ($\Delta V2$). For example, when positive electrode 10 is adopted as the reference electrode, an electrode different from the reference electrode is negative electrode 20. In this case, contact between the reference electrode and negative electrode 20 is detected based on increase in second potential difference ($\Delta V2$) (see FIG. 1). An insertion operation is controlled such that tubular member 1 stops when contact is detected. For example, tubular member 1 is released from first attachment portion 511 of drive device 501 (see FIG. 13).

An interval of measurement of the second potential difference ($\Delta V2$) may be set, for example, to at least 100 points/second. For example, an operator may check transition of the second potential difference ($\Delta V2$) on a display (a monitor) of voltage measurement device 502. The operator may detect variation (increase or decrease) in second potential difference ($\Delta V2$) and operate the drive device (a nail penetration test apparatus) for stopping tubular member 1.

Figure 14:
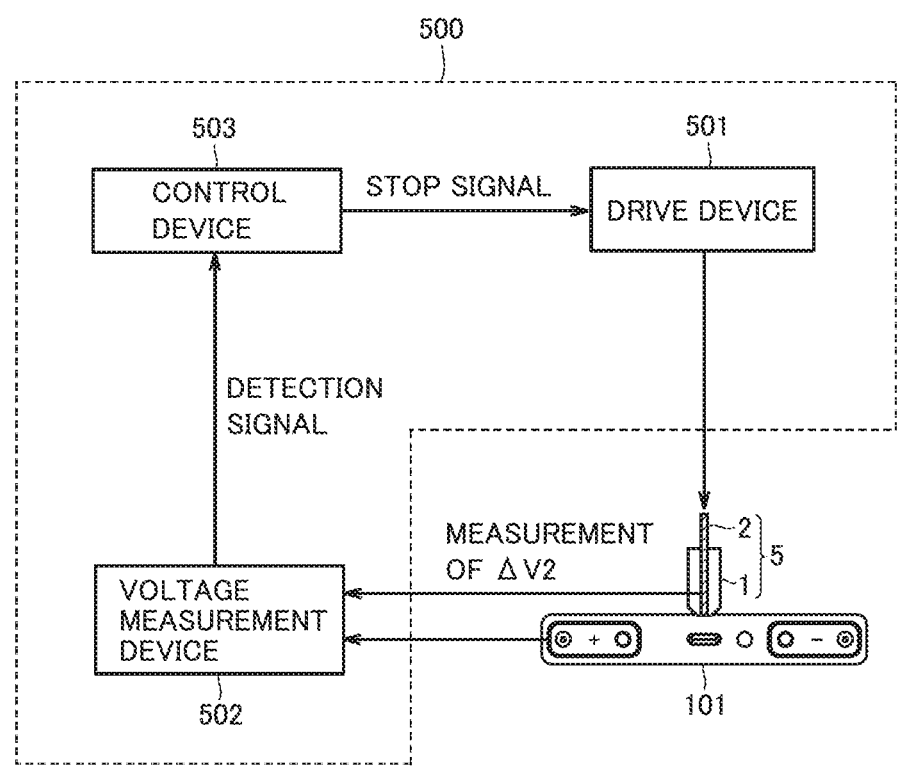
FIG. 14 is a block diagram showing one example of a test system according to the present embodiment.

FIG. 14 is a block diagram showing one example of a test system according to the present embodiment.

A test system 500 is a test system for the method of evaluating a power storage device in the present embodiment.

Test system 500 includes at least drive device 501, voltage measurement device 502, and a control device 503. Drive device 501 is configured to perform an operation to insert evaluation jig 5 into stack portion 50 along the direction of stack of positive electrode 10 and negative electrode 20.

For example, voltage measurement device 502 may detect variation (increase or decrease) beyond a threshold value of the second potential difference ($\Delta V2$). Voltage measurement device 502 may transmit a detection signal to control device 503 simultaneously with detection of variation. Control device 503 may transmit a stop signal to drive device 501 to stop tubular member 1 in response to the detection signal. Detection of variation in second potential difference ($\Delta V2$) and stop of tubular member 1 may substantially be simultaneous. There may be a slight time lag between detection of variation in second potential difference ($\Delta V2$) and stop of tubular member 1. The time lag may be, for example, not shorter than ten seconds and not longer than fifty seconds. For example, the time lag may be shorter than ten seconds.

The threshold value (trigger for stop) may be set, for example, to 10 mV. The insertion operation may be controlled to stop tubular member 1 at the time point of detection of variation (increase or decrease) by 10 mV or more in second potential difference ($\Delta V2$). The threshold value may be set, for example, to 50 mV. The threshold value may be set, for example, to 100 mV. The threshold value may be, for example, not lower than 50 mV and not higher than 100 mV.

<<(g) Short-Circuiting Through Needle-Shaped Member>>

The method of evaluating a power storage device in the present embodiment includes causing short-circuiting through needle-shaped member 2 by moving needle-shaped member 2 independently of tubular member 1 after tubular member 1 stops.

After tubular member 1 stops, insertion of needle-shaped member 2 is continued. Occurrence of short-circuiting through needle-shaped member 2 is detected based on variation (for example, decrease) in second potential difference ($\Delta V2$).

It is considered in the present embodiment that short-circuiting between single layers can occur and is detectable at least in each embodiment of evaluation shown in Table 1 below. The number of short-circuited layers is considered as being controllable in each embodiment of evaluation.

TABLE 1

Figure 15:
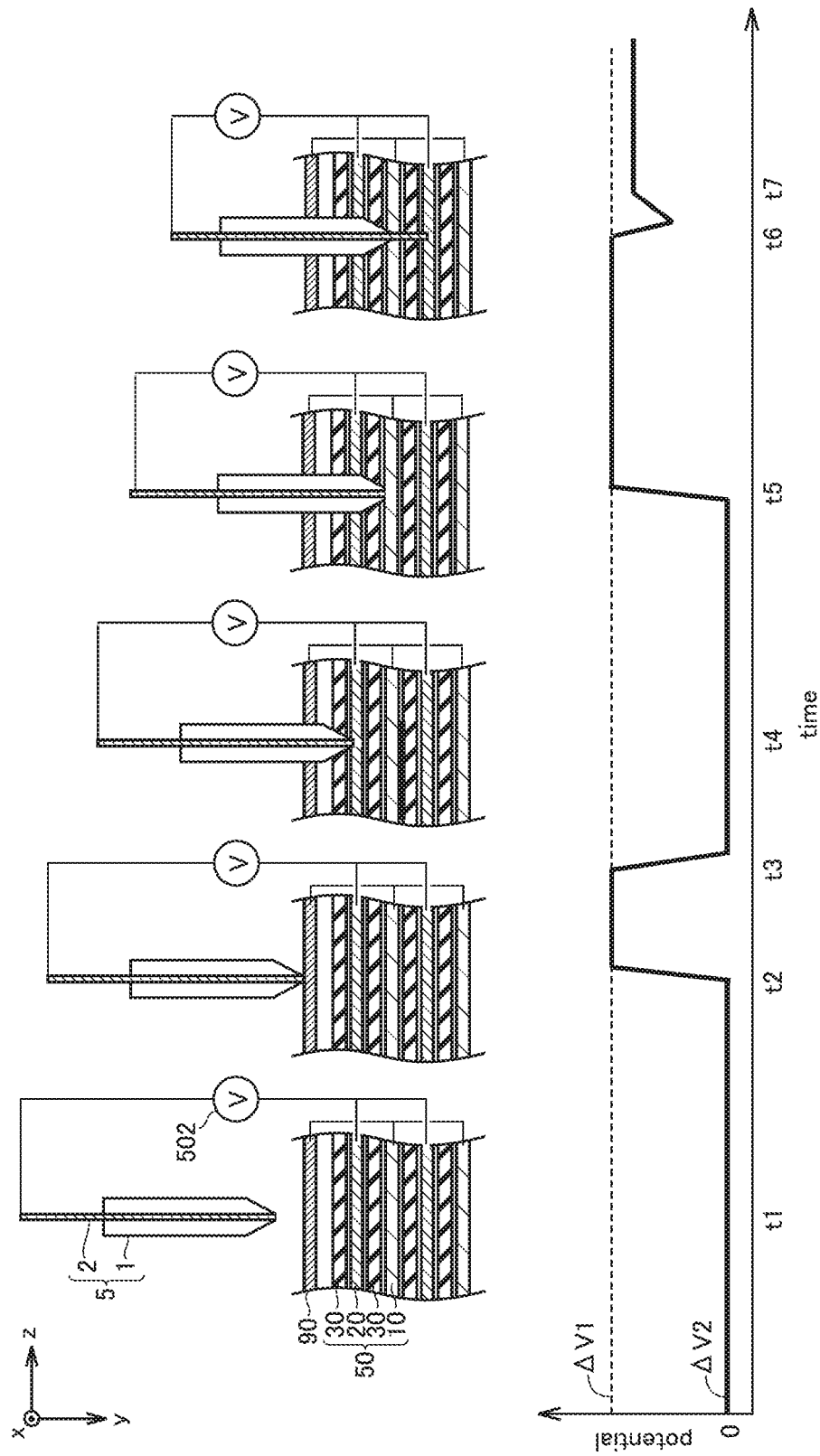
FIG. 15 is a conceptual diagram showing transition of the second potential difference in a second embodiment of evaluation.
Figure 16:
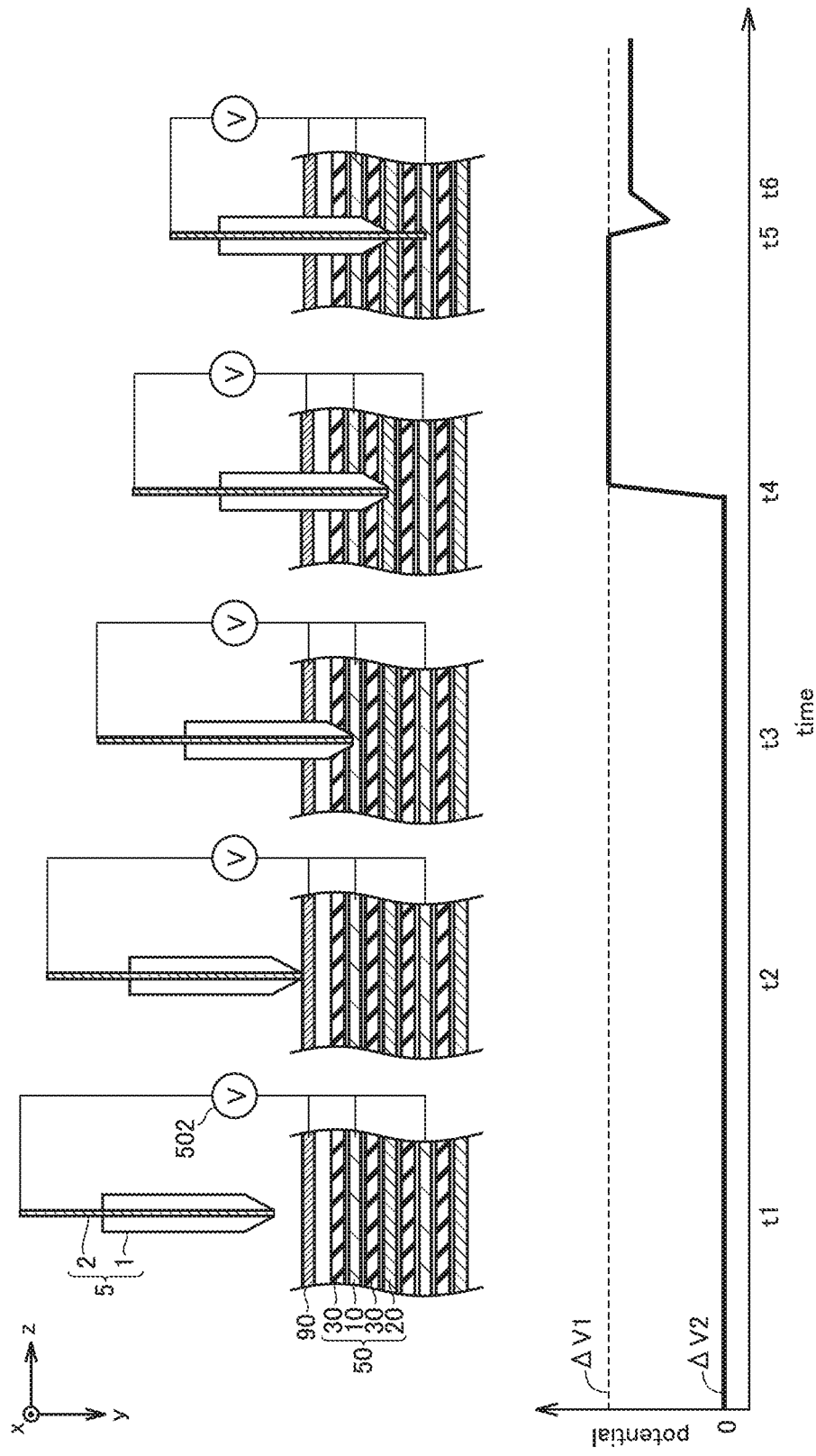
FIG. 16 is a conceptual diagram showing transition of the second potential difference in a third embodiment of evaluation.
Figure 17:
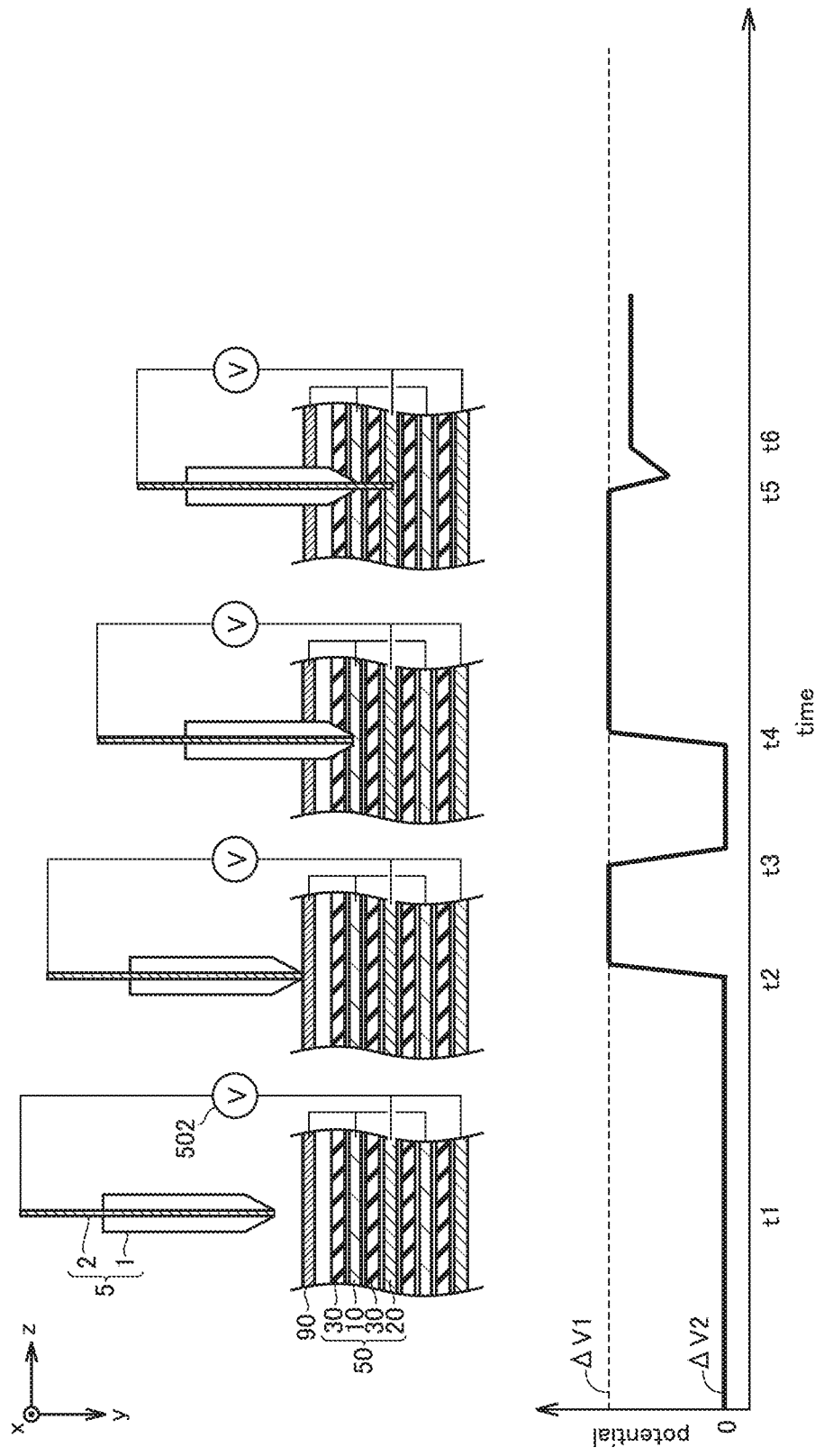
FIG. 17 is a conceptual diagram showing transition of the second potential difference in a fourth embodiment of evaluation.
Figure 18:
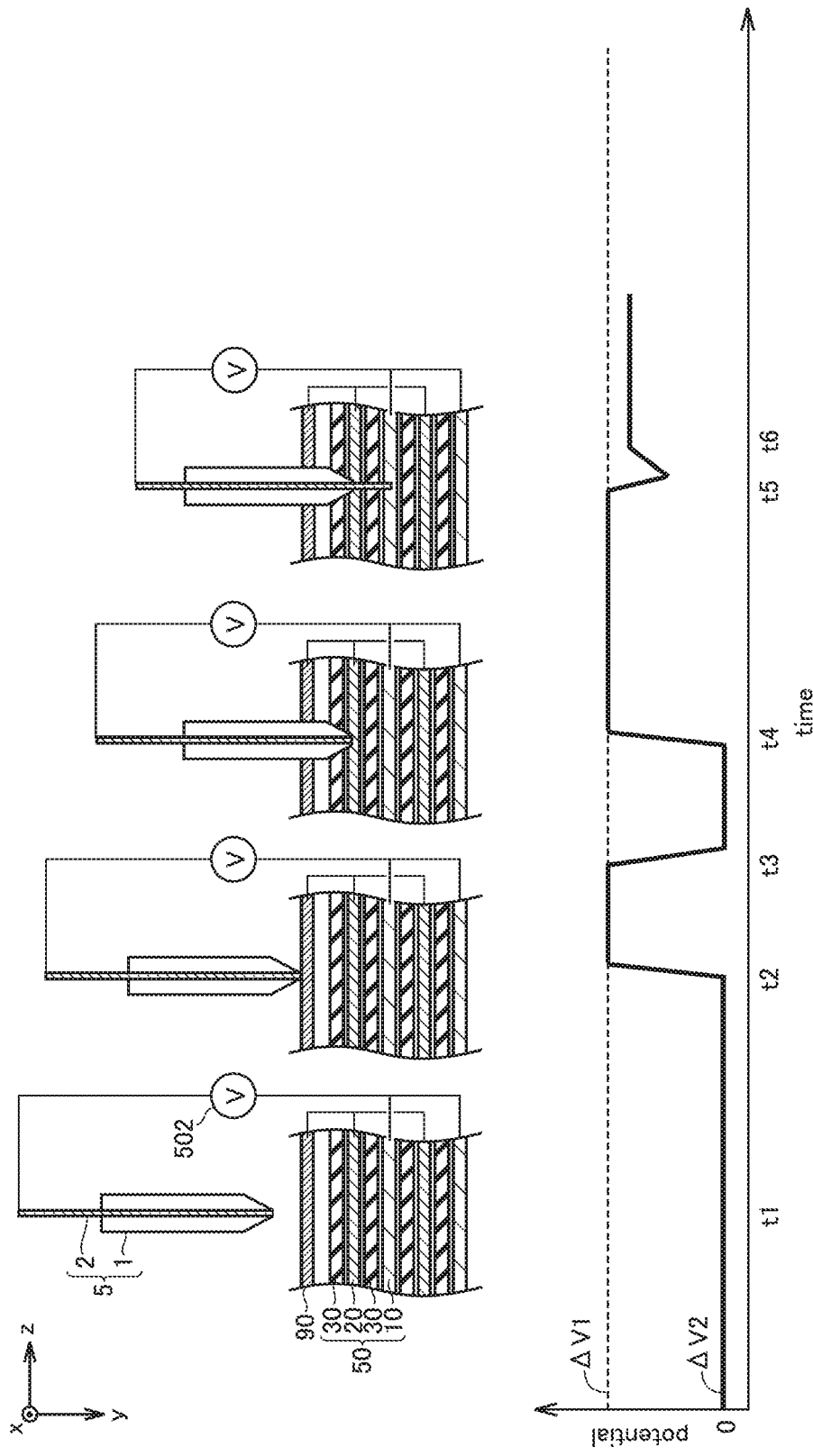
FIG. 18 is a conceptual diagram showing transition of the second potential difference in a fifth embodiment of evaluation.
Figure 19:
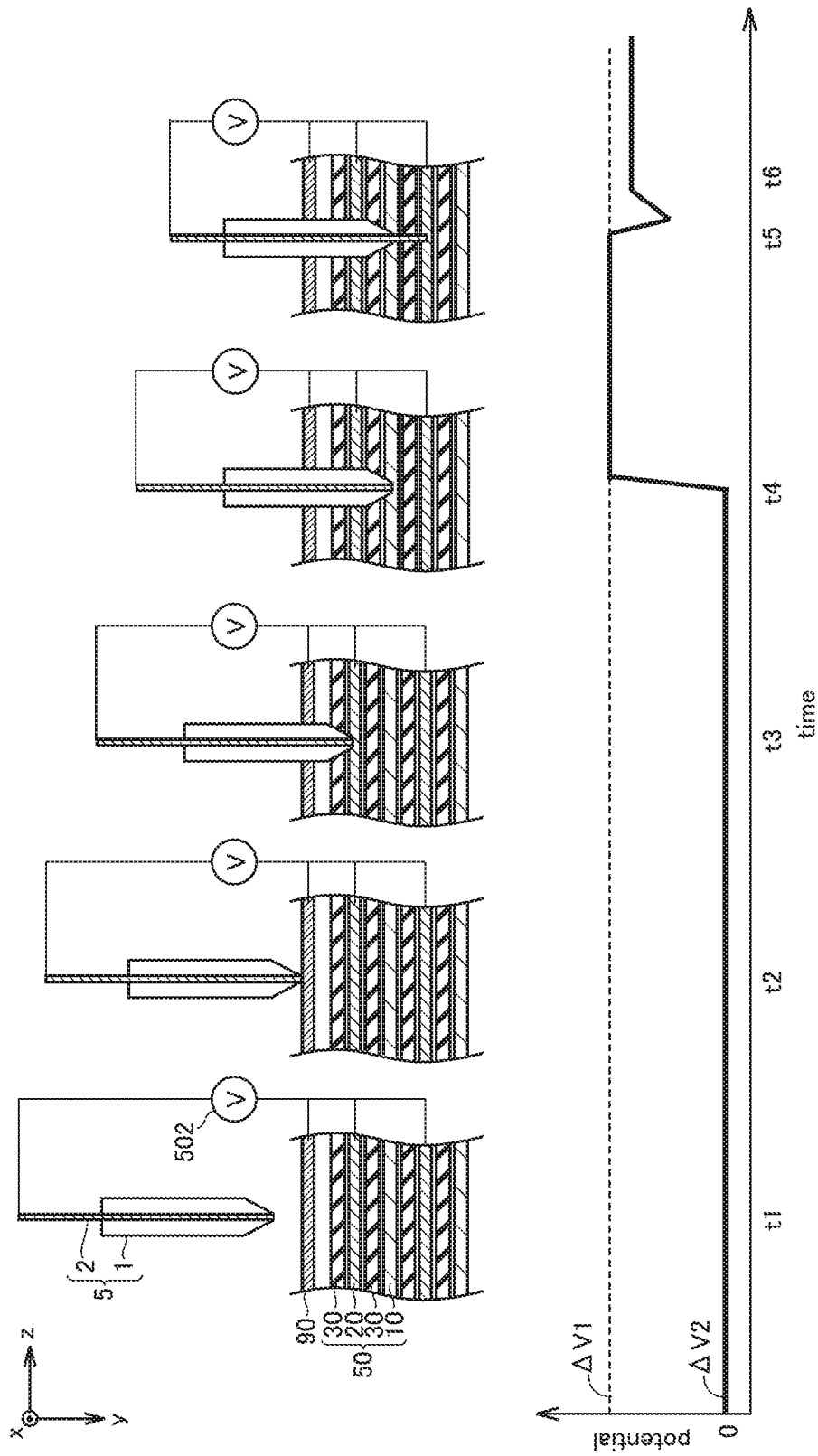
FIG. 19 is a conceptual diagram showing transition of the second potential difference in a sixth embodiment of evaluation.
Figure 20:
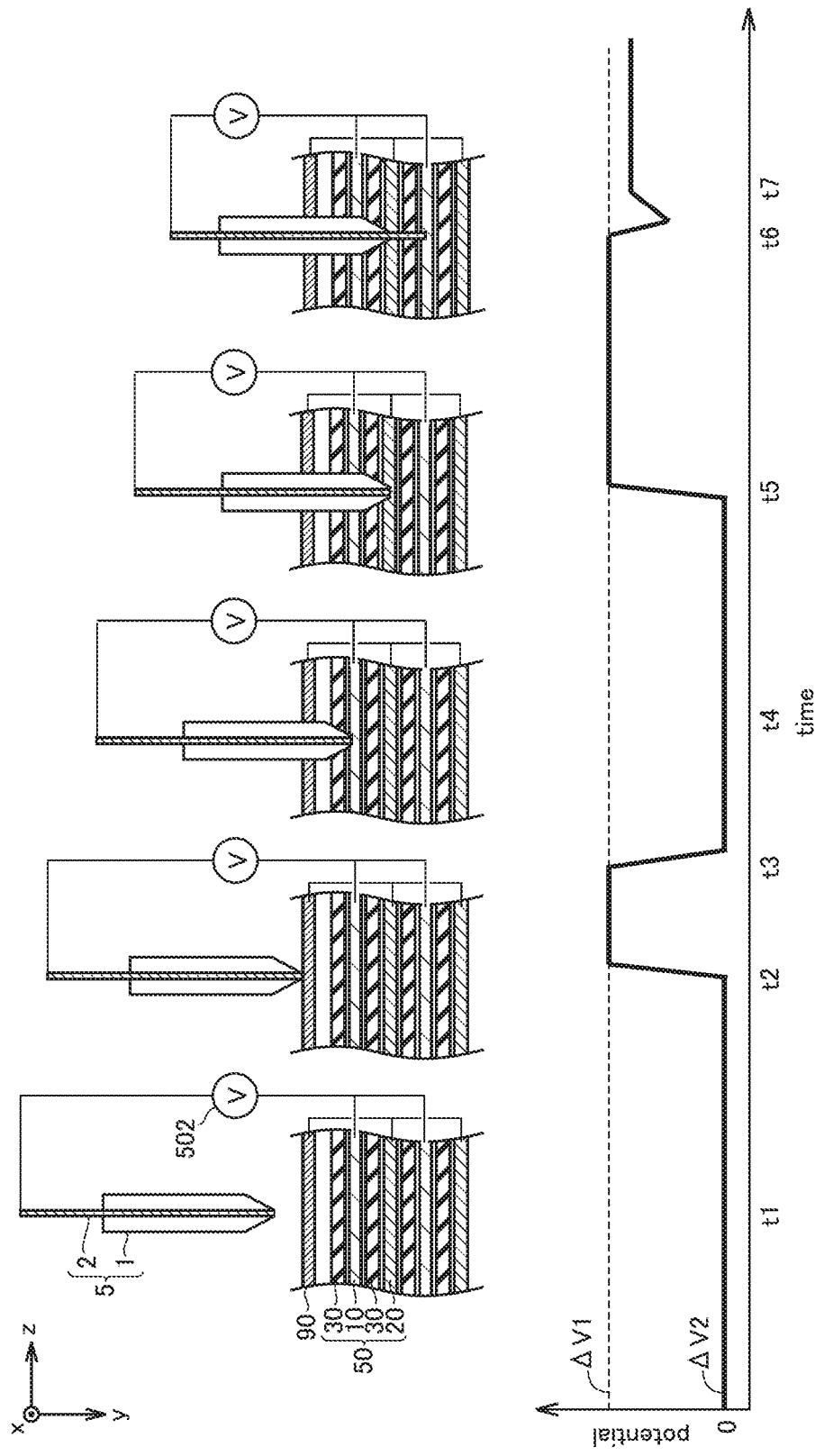
FIG. 20 is a conceptual diagram showing transition of the second potential difference in a seventh embodiment of evaluation.
Figure 21:
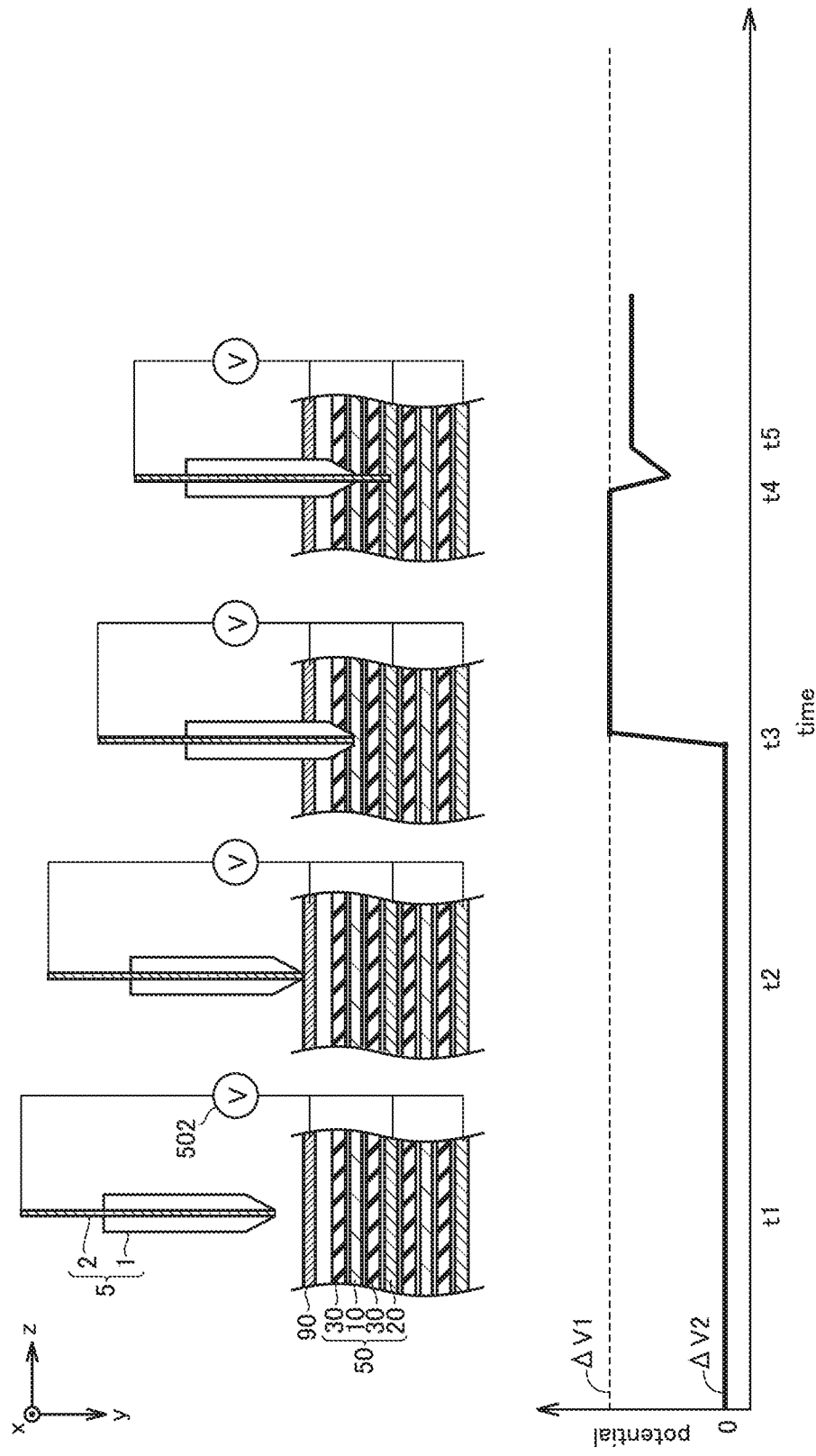
FIG. 21 is a conceptual diagram showing transition of the second potential difference in an eighth embodiment of evaluation.
Figure 22:
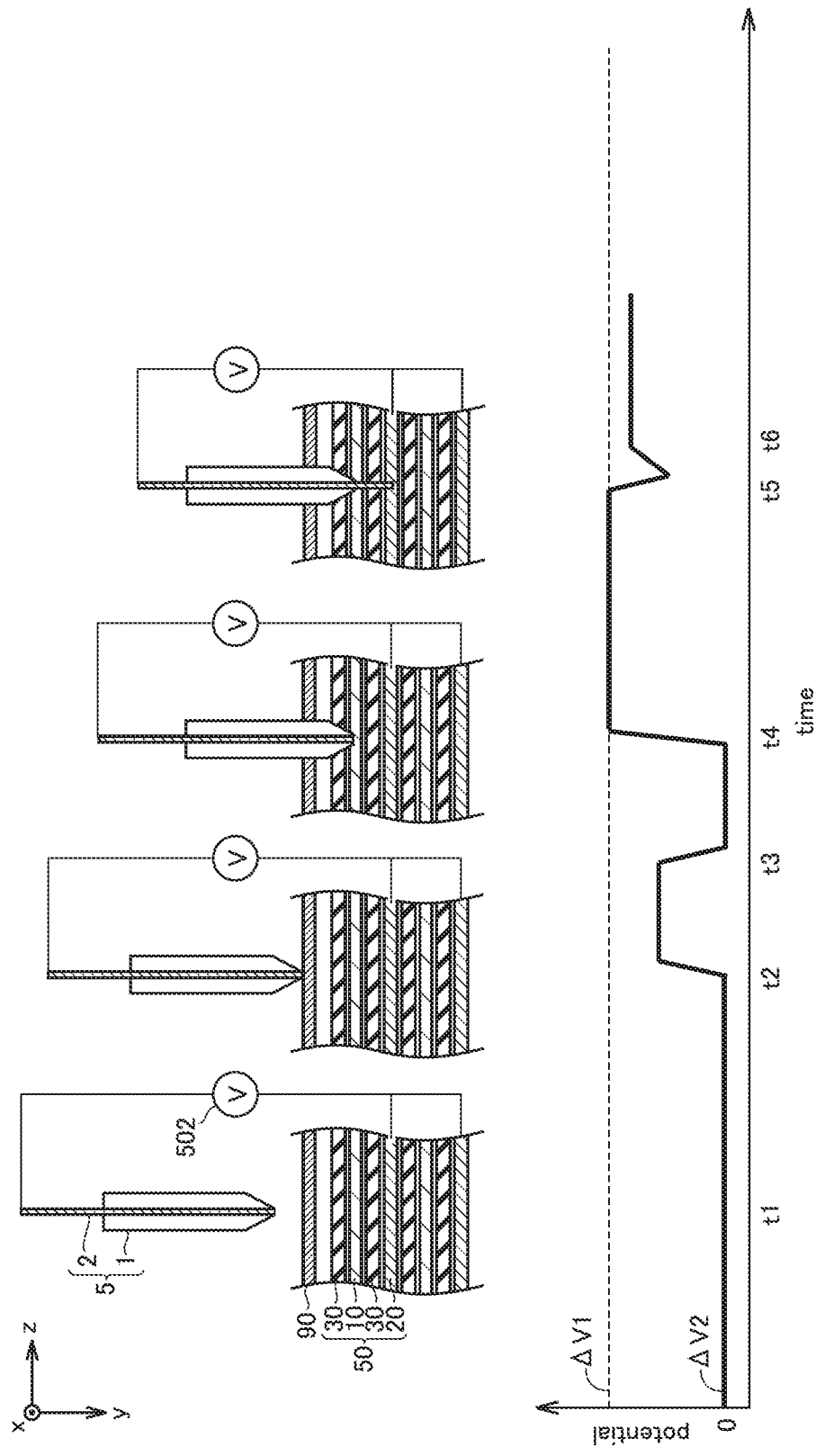
FIG. 22 is a conceptual diagram showing transition of the second potential difference in a ninth embodiment of evaluation.
Figure 23:
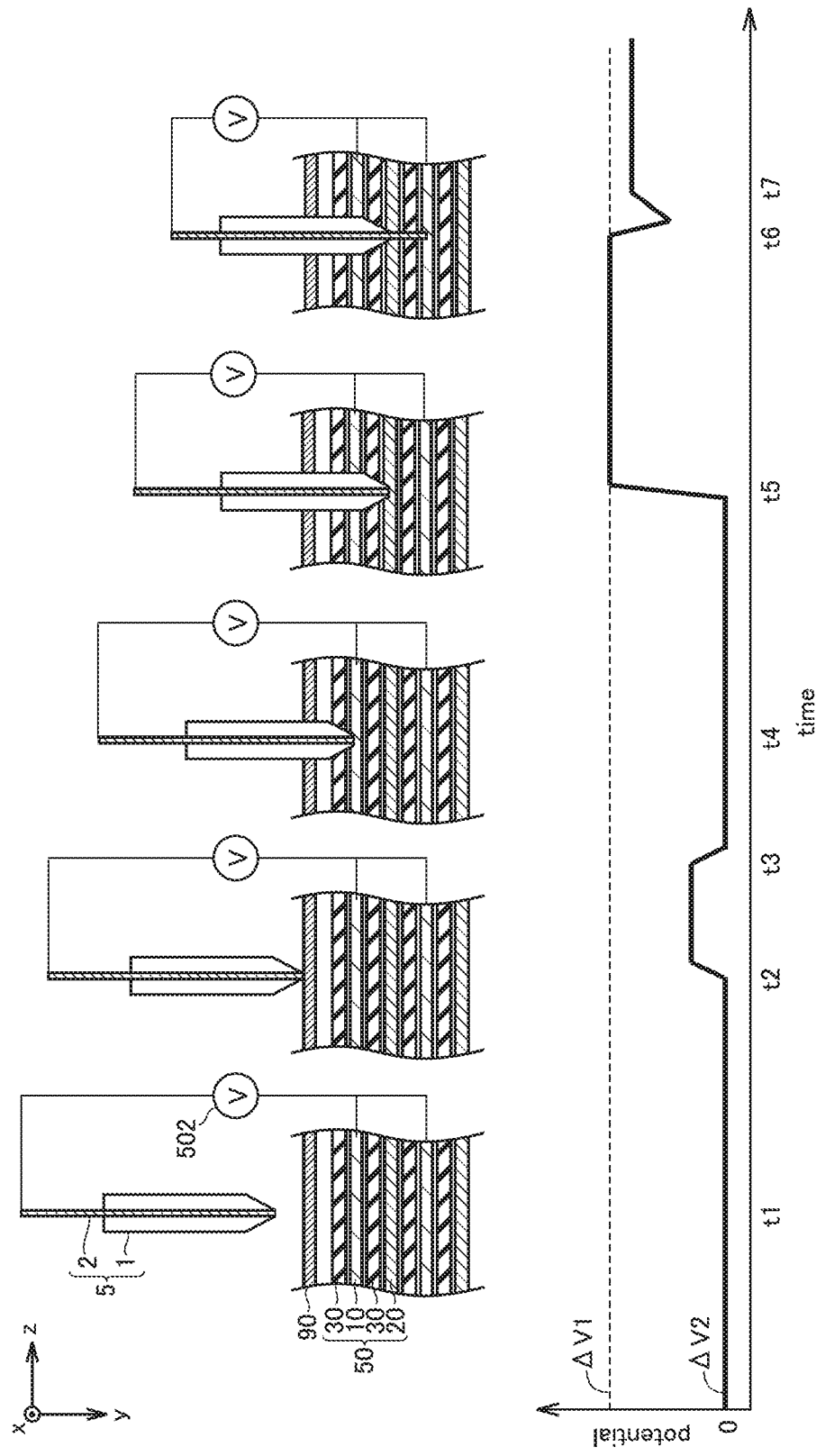
FIG. 23 is a conceptual diagram showing transition of the second potential difference in a tenth embodiment of evaluation.
Figure 24:
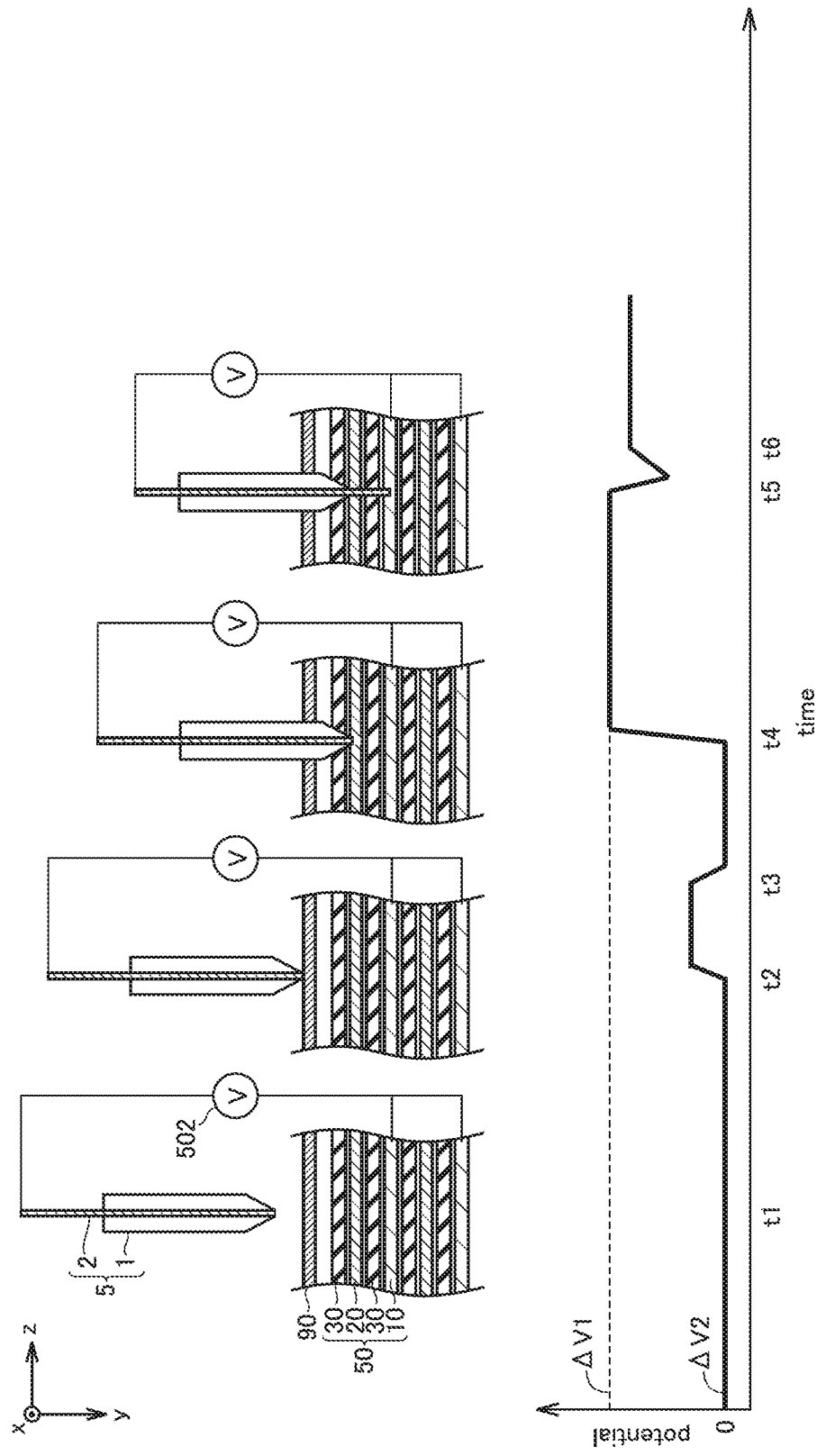
FIG. 24 is a conceptual diagram showing transition of the second potential difference in an eleventh embodiment of evaluation.
Figure 25:
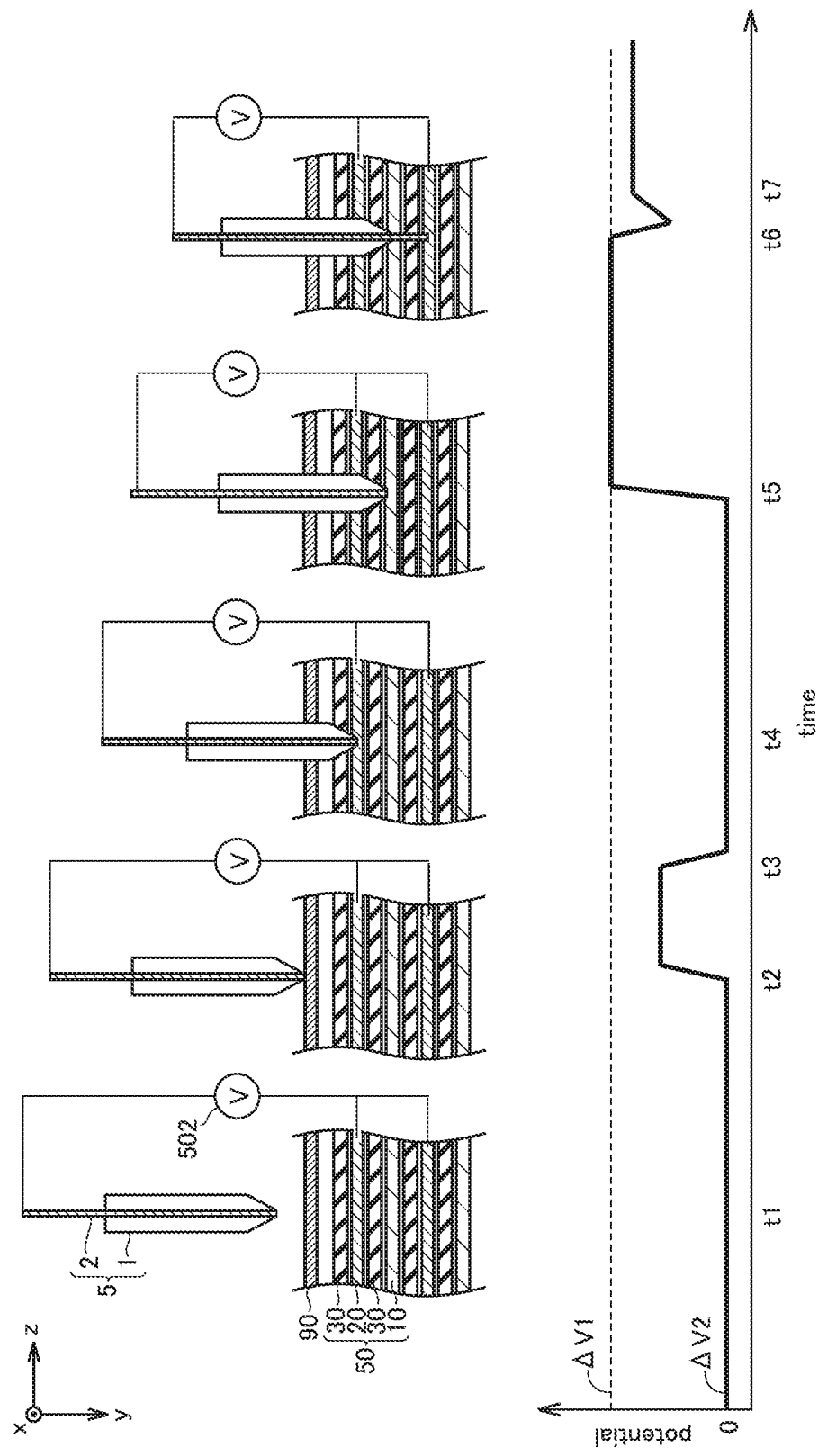
FIG. 25 is a conceptual diagram showing transition of the second potential difference in a twelfth embodiment of evaluation.

| | Construction of Power Storage Device | | | Transition of Second Potential Difference |
|---|---|---|---|---|
| | Potential of Housing | Outermost Electrode | Reference Electrode | |
| First Embodiment of Evaluation | Positive Electrode | Negative Electrode | Positive Electrode | FIG. 1 |
| Second Embodiment of Evaluation | Positive Electrode | Negative Electrode | Negative Electrode | FIG. 15 |
| Third Embodiment of Evaluation | Positive Electrode | Positive Electrode | Positive Electrode | FIG. 16 |
| Fourth Embodiment of Evaluation | Positive Electrode | Positive Electrode | Negative Electrode | FIG. 17 |
| Fifth Embodiment of Evaluation | Negative Electrode | Negative Electrode | Positive Electrode | FIG. 18 |
| Sixth Embodiment of Evaluation | Negative Electrode | Negative Electrode | Negative Electrode | FIG. 19 |
| Seventh Embodiment of Evaluation | Negative Electrode | Positive Electrode | Positive Electrode | FIG. 20 |
| Eighth Embodiment of Evaluation | Negative Electrode | Positive Electrode | Negative Electrode | FIG. 21 |
| Ninth Embodiment of Evaluation | Independent | Positive Electrode | Negative Electrode | FIG. 22 |
| Tenth Embodiment of Evaluation | Independent | Positive Electrode | Positive Electrode | FIG. 23 |
| Eleventh Embodiment of Evaluation | Independent | Negative Electrode | Positive Electrode | FIG. 24 |
| Twelfth Embodiment of Evaluation | Independent | Negative Electrode | Negative Electrode | FIG. 25 |

"Positive electrode" in the field of "potential of housing" in Table 1 indicates that housing 90 is electrically connected to positive electrode 10. "Negative electrode" in the field of "potential of housing" indicates that housing 90 is electrically connected to negative electrode 20. "Independent" in the field of "potential of housing" indicates that housing 90 is not electrically connected to positive electrode 10 and negative electrode 20, that is, indicates that housing 90 has a potential independent of positive electrode 10 and negative electrode 20. "Outermost electrode" represents an electrode located outermost in stack portion 50. A pattern of detection of short-circuiting in each example will be described.

First Embodiment of Evaluation

FIG. 1 shows transition of the second potential difference ($\Delta V2$) in a first embodiment of evaluation.

As described previously, in the first embodiment of evaluation, contact between an electrode (negative electrode 20) different from the reference electrode (positive electrode 10) and the tip end of needle-shaped member 2 can be detected based on increase in second potential difference ($\Delta V2$) at time point t3. Tubular member 1 is stopped at time point t3. After time point t3, needle-shaped member 2 is moved independently of tubular member 1. Occurrence of short-circuiting between single layers can be detected based on decrease in second potential difference ($\Delta V2$) at time point t4.

Short-circuiting between single layers may be caused a plurality of times in the present embodiment. Needle-shaped member 2 may cause short-circuiting between one positive electrode 10 and one negative electrode 20 a plurality of times. At time point t5, the second potential difference ($\Delta V2$) increases due to fusing. Thereafter, as needle-shaped member 2 is inserted further deeper, the second potential difference ($\Delta V2$) decreases at time point t6. Decrease in second potential difference ($\Delta V2$) at time point t6 may be due to short-circuiting between single layers for the second time. Similarly, it is considered that short-circuiting between single layers for the third time and short-circuiting between single layers for the fourth time can also further be caused.

Second Embodiment of Evaluation

FIG. 15 is a conceptual diagram showing transition of the second potential difference in a second embodiment of evaluation.

In the second embodiment of evaluation, second potential difference ($\Delta V2$) once increases at time point t2. It is considered that a potential difference between the reference electrode (negative electrode 20) and positive electrode 10 is detected through housing 90 and needle-shaped member 2 at time point t2. The second potential difference ($\Delta V2$) is considered to decrease substantially to 0 V as a result of penetration of evaluation jig 5 through housing 90 at time point t3.

The tip end of needle-shaped member 2 comes in contact with negative electrode 20 (outermost electrode) at time point t4. The second potential difference ($\Delta V2$) is considered as remaining at substantially 0 V at time point t4.

The tip end of needle-shaped member 2 comes in contact with positive electrode 10 at time point t5. The second potential difference ($\Delta V2$) is thus considered to increase. Contact between an electrode (positive electrode 10) different from the reference electrode (negative electrode 20) and the tip end of needle-shaped member 2 can be detected based on increase in second potential difference ($\Delta V2$) at time point t5. Tubular member 1 is stopped at time point t5. After time point t5, needle-shaped member 2 is moved independently of tubular member 1. Occurrence of short-circuiting between single layers can be detected based on decrease in second potential difference ($\Delta V2$) at time point t6.

Third Embodiment of Evaluation

FIG. 16 is a conceptual diagram showing transition of the second potential difference in a third embodiment of evaluation.

In the third embodiment of evaluation, the second potential difference ($\Delta V2$) is considered as being substantially 0 V during a period from time point t1 until time point t4. Contact between an electrode (negative electrode 20) different from the reference electrode (positive electrode 10) and the tip end of needle-shaped member 2 can be detected based on increase in second potential difference ($\Delta V2$) at time point t4. Tubular member 1 is stopped at time point t4. After time point t4, needle-shaped member 2 is moved independently of tubular member 1. Occurrence of short-circuiting between single layers can be detected based on decrease in second potential difference ($\Delta V2$) at time point t5.

Fourth Embodiment of Evaluation

FIG. 17 is a conceptual diagram showing transition of the second potential difference in a fourth embodiment of evaluation.

In the fourth embodiment of evaluation, the second potential difference ($\Delta V2$) once increases at time point t2. It is considered that a potential difference between the reference electrode (negative electrode 20) and positive electrode 10 is detected through housing 90 and needle-shaped member 2 at time point t2. The second potential difference (ΔV2) is considered to decrease to substantially 0 V at time point t3 as a result of penetration of evaluation jig 5 through housing 90.

Thereafter, contact between an electrode (positive electrode 10) different from the reference electrode (negative electrode 20) and the tip end of needle-shaped member 2 can be detected based on increase in second potential difference (ΔV2) at time point t4. Tubular member 1 is stopped at time point t4. After time point t4, needle-shaped member 2 is moved independently of tubular member 1. Occurrence of short-circuiting between single layers can be detected based on decrease in second potential difference (ΔV2) at time point t5.

Fifth Embodiment of Evaluation

FIG. 18 is a conceptual diagram showing transition of the second potential difference in a fifth embodiment of evaluation.

In the fifth embodiment of evaluation, the second potential difference (ΔV2) increases owing to contact of the tip end of needle-shaped member 2 with housing 90 at time point t2. The second potential difference (ΔV2) is considered to decrease to substantially 0 V at time point t3 as a result of penetration of evaluation jig 5 through housing 90.

Thereafter, contact between an electrode (negative electrode 20) different from the reference electrode (positive electrode 10) and the tip end of needle-shaped member 2 can be detected based on increase in second potential difference (ΔV2) at time point t4. Tubular member 1 is stopped at time point t4. After time point t4, needle-shaped member 2 is moved independently of tubular member 1. Occurrence of short-circuiting between single layers can be detected based on decrease in second potential difference (ΔV2) at time point t5.

Sixth Embodiment of Evaluation

FIG. 19 is a conceptual diagram showing transition of the second potential difference in a sixth embodiment of evaluation.

In the sixth embodiment of evaluation, the second potential difference (ΔV2) is considered as being substantially 0 V during a period from time point t1 until time point t4. Contact between an electrode (positive electrode 10) different from the reference electrode (negative electrode 20) and the tip end of needle-shaped member 2 can be detected based on increase in second potential difference (ΔV2) at time point t4. Tubular member 1 is stopped at time point t4. After time point t4, needle-shaped member 2 is moved independently of tubular member 1. Occurrence of short-circuiting between single layers can be detected based on decrease in second potential difference (ΔV2) at time point t5.

Seventh Embodiment of Evaluation

FIG. 20 is a conceptual diagram showing transition of the second potential difference in a seventh embodiment of evaluation.

In the seventh embodiment of evaluation, the second potential difference (ΔV2) once increases owing to contact of the tip end of needle-shaped member 2 with housing 90 at time point t2. The second potential difference (ΔV2) is considered to decrease to substantially 0 V at time point t3 as a result of penetration of evaluation jig 5 through housing 90.

The tip end of needle-shaped member 2 comes in contact with positive electrode 10 (outermost electrode) at time point t4. The second potential difference (ΔV2) is considered as remaining at substantially 0 V at time point t4.

Thereafter, contact between an electrode (negative electrode 20) different from the reference electrode (positive electrode 10) and the tip end of needle-shaped member 2 can be detected based on increase in second potential difference (ΔV2) at time point t5. Tubular member 1 is stopped at time point t5. After time point t5, needle-shaped member 2 is moved independently of tubular member 1. Occurrence of short-circuiting between single layers can be detected based on decrease in second potential difference (ΔV2) at time point t6.

Eighth Embodiment of Evaluation

FIG. 21 is a conceptual diagram showing transition of the second potential difference in an eighth embodiment of evaluation.

In the eighth embodiment of evaluation, the second potential difference (ΔV2) is considered as being substantially 0 V during a period from time point t1 until time point t3. Contact between an electrode (positive electrode 10) different from the reference electrode (negative electrode 20) and the tip end of needle-shaped member 2 can be detected based on increase in second potential difference (ΔV2) at time point t3. Tubular member 1 is stopped at time point t3. After time point t3, needle-shaped member 2 is moved independently of tubular member 1. Occurrence of short-circuiting between single layers can be detected based on decrease in second potential difference (ΔV2) at time point t4. cl Ninth Embodiment of Evaluation FIG. 22 is a conceptual diagram showing transition of the second potential difference in a ninth embodiment of evaluation.

In the ninth embodiment of evaluation, the second potential difference (ΔV2) once increases owing to contact of the tip end of needle-shaped member 2 with housing 90 at time point t2. In the ninth embodiment of evaluation, housing 90 is not electrically connected to positive electrode 10 and negative electrode 20. It is therefore considered that a potential difference between housing 90 and the reference electrode (negative electrode 20) is detected at time point t2. The second potential difference (ΔV2) is considered to decrease to substantially 0 V at time point t3 as a result of penetration of evaluation jig 5 through housing 90.

Thereafter, contact between an electrode (positive electrode 10) different from the reference electrode (negative electrode 20) and the tip end of needle-shaped member 2 can be detected based on increase in second potential difference (ΔV2) at time point t4. Tubular member 1 is stopped at time point t4. After time point t4, needle-shaped member 2 is moved independently of tubular member 1. Occurrence of short-circuiting between single layers can be detected based on decrease in second potential difference (ΔV2) at time point t5.

Tenth Embodiment of Evaluation

FIG. 23 is a conceptual diagram showing transition of the second potential difference in a tenth embodiment of evaluation.

Housing 90 is not electrically connected to positive electrode 10 and negative electrode 20 either in the tenth embodiment of evaluation. It is therefore considered that a potential difference between housing 90 and the reference electrode (positive electrode 10) is detected at time point t2. The second potential difference ($\Delta V2$) is considered to decrease to substantially 0 V at time point t3 as a result of penetration of evaluation jig 5 through housing 90. The tip end of needle-shaped member 2 comes in contact with the outermost electrode (positive electrode 10) at time point t4. The second potential difference ($\Delta V2$) is considered as being substantially 0 V at time point t4.

Thereafter, contact between an electrode (negative electrode 20) different from the reference electrode (positive electrode 10) and the tip end of needle-shaped member 2 can be detected based on increase in second potential difference ($\Delta V2$) at time point t5. Tubular member 1 is stopped at time point t5. After time point t5, needle-shaped member 2 is moved independently of tubular member 1. Occurrence of short-circuiting between single layers can be detected based on decrease in second potential difference ($\Delta V2$) at time point t6.

Eleventh Embodiment of Evaluation

FIG. 24 is a conceptual diagram showing transition of the second potential difference in an eleventh embodiment of evaluation.

Housing 90 is not electrically connected to positive electrode 10 and negative electrode 20 either in the eleventh embodiment of evaluation. It is therefore considered that a potential difference between housing 90 and the reference electrode (positive electrode 10) is detected at time point t2. The second potential difference ($\Delta V2$) is considered to decrease to substantially 0 V at time point t3 as a result of penetration of evaluation jig 5 through housing 90.

Thereafter, contact between an electrode (negative electrode 20) different from the reference electrode (positive electrode 10) and the tip end of needle-shaped member 2 can be detected based on increase in second potential difference ($\Delta V2$) at time point t4. Short-circuiting between single layers can be detected based on decrease in second potential difference ($\Delta V2$) at time point t5.

Twelfth Embodiment of Evaluation

FIG. 25 is a conceptual diagram showing transition of the second potential difference in a twelfth embodiment of evaluation.

Housing 90 is not electrically connected to positive electrode 10 and negative electrode 20 either in the twelfth embodiment of evaluation. It is therefore considered that a potential difference between housing 90 and the reference electrode (negative electrode 20) is detected at time point t2. The second potential difference ($\Delta V2$) is considered to decrease to substantially 0 V at time point t3 as a result of penetration of evaluation jig 5 through housing 90. The tip end of needle-shaped member 2 comes in contact with the outermost electrode (negative electrode 20) at time point t4. The second potential difference ($\Delta V2$) is considered as being substantially 0 V at time point t4.

Thereafter, contact between an electrode (positive electrode 10) different from the reference electrode (negative electrode 20) and the tip end of needle-shaped member 2 can be detected based on increase in second potential difference ($\Delta V2$) at time point t5. Occurrence of short-circuiting between single layers can be detected based on decrease in second potential difference ($\Delta V2$) at time point t6.

(Additional Aspect)

Transition of the second potential difference ($\Delta V2$) in the first to twelfth embodiments of evaluation is merely by way of example. So long as contact between an electrode different from the reference electrode and the tip end of needle-shaped member 2 is detected based on variation in second potential difference ($\Delta V2$) and occurrence of short-circuiting can be detected based on variation in second potential difference ($\Delta V2$), the second potential difference ($\Delta V2$) may exhibit transition other than the transition exemplified here.

<<(h) Evaluation>>

The method of evaluating a power storage device in the present embodiment includes evaluating a power storage device based on a state of the power storage device that is short-circuiting.

For example, in FIG. 1, a state of first power storage device 101 which is undergoing short-circuiting between single layers is checked during a period from time point t4 until time point t5.

For example, at least one selected from the group consisting of an appearance of first power storage device 101, a surface temperature of first power storage device 101, and a voltage of first power storage device 101 may be checked. The appearance may visually be checked. The appearance may be recorded, for example, in video images and still images. For example, deformation, discoloration, fracture, liquid leakage, or smoking may occur in the appearance. A temperature is measured with a temperature measurement device. A thermal distribution may be measured, for example, with thermography. A voltage (a potential difference between positive electrode 10 and negative electrode 20) is measured with a voltmeter.

A state may be checked also after time point t5. A state of first power storage device 101 may be checked, for example, for a period not shorter than ten seconds and not longer than one hour after occurrence of short-circuiting. A state of first power storage device 101 may be checked, for example, for a period not shorter than one minute and not longer than thirty minutes after occurrence of short-circuiting.

First power storage device 101 is evaluated based on a result of checking of the state. First power storage device 101 may be evaluated based on results of checking of a plurality of first power storage devices 101.

In some cases, first power storage device 101 cannot be evaluated as good or defective based on a state on the occurrence of short-circuiting between single layers. In this case, first power storage device 101 may be evaluated as good or defective also by causing short-circuiting between single layers a plurality of times and evaluating a state of first power storage device 101 each time.

<Method of Manufacturing Power Storage Device>

Figure 26:
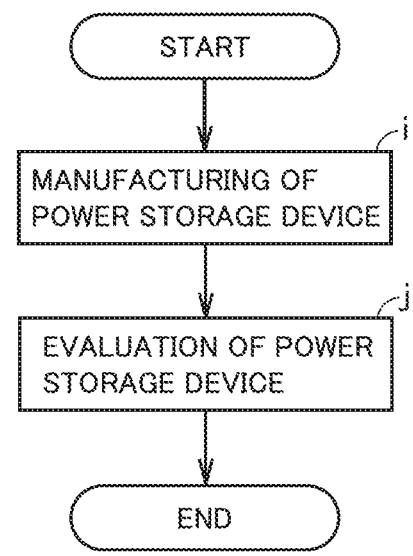
FIG. 26 is a flowchart showing overview of a method of manufacturing a power storage device according to the present embodiment.

FIG. 26 is a flowchart showing overview of a method of manufacturing a power storage device according to the present embodiment.

The method of manufacturing a power storage device in the present embodiment includes at least "(i) manufacturing of power storage device" and "(j) evaluation of power storage device."

<<(i) Manufacturing of Power Storage Device>>

The method of manufacturing a power storage device in the present embodiment includes manufacturing a plurality of first power storage devices 101.

The method of manufacturing first power storage device 101 should not particularly be limited. First power storage device 101 can be manufactured as appropriate in accordance with specifications thereof. A plurality of first power storage devices 101 identical in specifications may be manufactured. A plurality of first power storage devices 101 different in specifications may be manufactured.

<<(j) Evaluation of Power Storage Device>>

The method of manufacturing a power storage device in the present embodiment includes evaluating one or more first power storage devices 101 among a plurality of first power storage devices 101 with the method of evaluating a power storage device in the present embodiment described previously.

The method of evaluating a power storage device in the present embodiment may be used, for example, for a sampling inspection during manufacturing. For example, one or more first power storage devices 101 may be taken out of a certain manufacturing lot. Whether or not the manufacturing lot is good may be determined based on a result of evaluation of one or more first power storage devices 101. According to the method of manufacturing a power storage device in the present embodiment, first power storage device 101 which can exhibit prescribed capability on the occurrence of internal short-circuiting can be manufactured.

The method of evaluating a power storage device in the present embodiment may be used, for example, for reviewing specifications during development. For example, a plurality of first power storage devices 101 according to certain specifications may be manufactured. Whether or not the specifications are to be adopted may be determined based on a result of evaluation of one or more first power storage devices 101. According to the method of manufacturing a power storage device in the present embodiment, first power storage device 101 which can exhibit prescribed capability on the occurrence of internal short-circuiting can be provided.

EXAMPLES

Examples of the present disclosure will be described below. The description below does not limit the scope of claims.

<Specifications of Power Storage Device>

A plurality of first power storage devices 101 (prismatic lithium ion batteries) were prepared. Specifications of first power storage device 101 are as follows.

Rated capacity: 25 Ah
Charge upper limit voltage: 4.1 V
Discharge lower limit voltage: 3 V
First housing: made of Al alloy (first housing 91 being electrically connected to positive electrode 10)
Electrode assembly: wound electrode assembly (negative electrode 20 being selected as the outermost electrode)
Positive electrode active material: lithium nickel cobalt manganese composite oxide
Negative electrode active material: graphite
Separator: porous film made of resin (three-layered structure)

Comparative Example 1

In Comparative Example 1, first power storage device 101 was evaluated with the evaluation method in conformity with Japanese Patent Laying-Open No. 2010-250954. A ceramic nail was adopted as the evaluation jig. The ceramic nail includes an insulating rod and a conductive member. The insulating rod is made of a ceramic material. The conductive member is provided at the tip end of the insulating rod. The conductive member is not constructed to be movable independently of the insulating rod. An angle at the tip end of the conductive member is set to forty-five degrees. The insulating rod has a diameter of 3 mm.

The evaluation jig was inserted in first power storage device 101. The evaluation jig was stopped when voltage lowering by 2 mV was detected. After the evaluation jig was stopped, first power storage device 101 was disassembled and the number of short-circuited layers was checked. In Comparative Example 1, the number of short-circuited layers was four to six. The number of short-circuited layers is considered as being uncontrollable in Comparative Example 1.

Example 1

Example 1 was implemented with a target number of short-circuited layers being set to one. The target number of short-circuited layers being set to one means that short-circuiting occurs between one positive electrode 10 and one negative electrode 20, that is, short-circuiting between single layers occurs.

In Example 1, evaluation jig 5 in the present embodiment was used. Specifications of evaluation jig 5 are shown in Table 2 below. As shown in FIG. 1, increase in second potential difference ($\Delta V2$) was detected at time point t3. Tubular member 1 was stopped at time point t3. After time point t3, needle-shaped member 2 was moved independently of tubular member 1. As needle-shaped member 2 was inserted in stack portion 50, decrease in second potential difference ($\Delta V2$) was detected at time point t4. Needle-shaped member 2 was stopped at time point t4.

After needle-shaped member 2 was stopped, first power storage device 101 was disassembled and the number of short-circuited layers was checked. The number of short-circuited layers was one in Example 1. The number of short-circuited layers is considered as being controllable in Example 1.

Example 2

Example 2 was implemented with a target number of short-circuited layers being set to two. The target number of short-circuited layers being set to two means that short-circuiting between single layers occurs twice. As shown in Table 2 below, in Example 2, tubular member 1 having an angle at the tip end (θ1) of ninety degrees was used.

Operations the same as in Example 1 were performed until time point t4 in FIG. 1. From time point t5, needle-shaped member 2 was inserted deeper. Decrease in second potential difference ($\Delta V2$) was detected at time point t6. Needle-shaped member 2 was then stopped.

After needle-shaped member 2 was stopped, first power storage device 101 was disassembled and the number of short-circuited layers was checked. The number of short-circuited layers was two in Example 2. The number of short-circuited layers is considered as being controllable also in Example 2.

Examples 3 and 4

Examples 3 and 4 were implemented with a target number of short-circuited layers being set to one. Operations the same as in Example 1 were performed except for use of evaluation jigs 5 shown in Table 2 below. After needle-shaped member 2 was stopped, first power storage device 101 was disassembled and the number of short-circuited layers was checked. The number of short-circuited layers was one in Examples 3 and 4. The number of short-circuited layers is considered as being controllable also in Examples 3 and 4.

Example 5

Example 5 was implemented with a target number of short-circuited layers being set to two. Operations the same as in Example 2 were performed except for use of evaluation jig 5 shown in Table 2 below. After needle-shaped member 2 was stopped, first power storage device 101 was disassembled and the number of short-circuited layers was checked. The number of short-circuited layers was two in Example 5. The number of short-circuited layers is considered as being controllable also in Example 5.

Comparative Example 2

Figure 2:
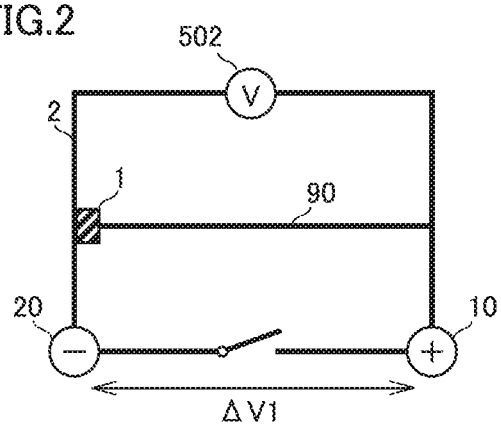
FIG. 2 is a second conceptual diagram for illustrating the method of evaluating a power storage device according to the present disclosure.
Figure 3:
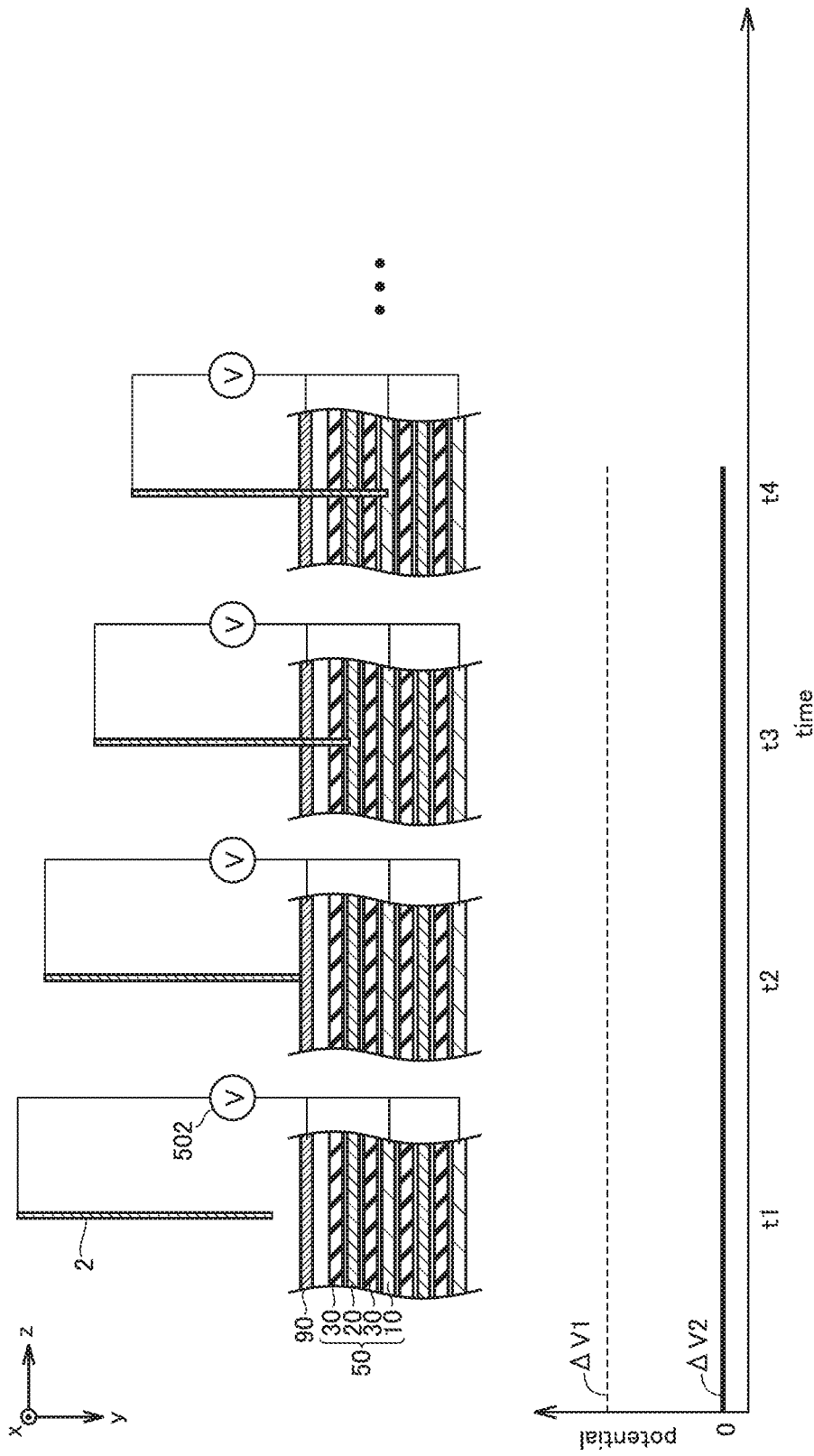
FIG. 3 is a third conceptual diagram for illustrating the method of evaluating a power storage device according to the present disclosure.
Figure 4:
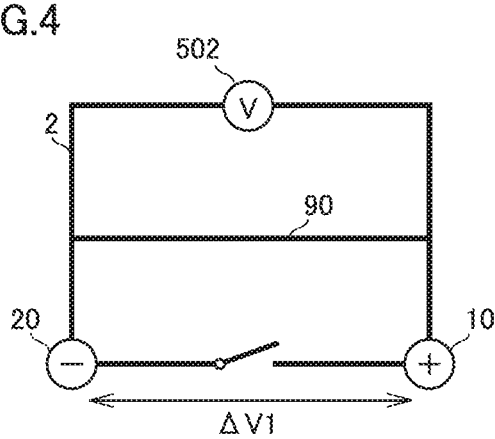
FIG. 4 is a fourth conceptual diagram for illustrating the method of evaluating a power storage device according to the present disclosure.

Comparative Example 2 was implemented with a target number of short-circuited layers being set to one. In Comparative Example 2, evaluation jig 5 shown in Table 2 below was used. In Comparative Example 2, as with the transition of the second potential difference ($\Delta V2$) shown in FIG. 2, the variation in the second potential difference ($\Delta V2$) was not detected. In Comparative Example 2, the ratio ($\phi 2/\phi 1$) exceeds 60%. Short-circuiting through needle-shaped member 2 and first housing 91 is considered to have occurred due to chipping of tubular member 1 when evaluation jig 5 penetrated first housing 91. It is considered that, in Comparative Example 2, an operation to insert evaluation jig 5 into first power storage device 101 such that a portion other than the tip end of needle-shaped member 2 and first housing 91 were separated from each other by tubular member 1 was not performed. The number of short-circuited layers is considered as being uncontrollable in Comparative Example 2.

positive electrode and a negative electrode, at least one positive electrode and at least one negative electrode being alternately stacked to form a stack portion in the electrode assembly;

preparing an evaluation jig, the evaluation jig including an insulating tubular member and a conductive needle-shaped member, the needle-shaped member being inserted through the tubular member, and the needle-shaped member being constructed to be movable independently of the tubular member;

adjusting a charge level of the power storage device to produce a first potential difference between the positive electrode and the negative electrode;

selecting the positive electrode or the negative electrode as a reference electrode;

performing an operation to insert the evaluation jig into the power storage device such that a portion other than a tip end of the needle-shaped member and the housing are separated from each other by the tubular member;

controlling the operation to insert the evaluation jig to stop the tubular member when the tip end of the needle-shaped member comes in contact with an electrode different from the reference electrode in the stack portion;

causing short-circuiting through the needle-shaped member by moving the needle-shaped member independently of the tubular member after the tubular member is stopped; and evaluating the power storage device based on a state of the power storage device that is short-circuiting, contact between the electrode different from the reference electrode and the tip end of the needle-shaped member being detected based on variation in second potential difference between the reference electrode and the needle-shaped member, and

TABLE 2

| | | | Comparative Example 1 | Example 1 | Example 2 | Example 3 | Example 4 | Example 5 | Comparative Example 2 |
|---|---|---|---|---|---|---|---|---|---|
| Evaluation Jig | Tubular Member | Angle at Tip End ($\theta 1$) | —* | 20 Degrees | 90 Degrees | 45 Degrees | 45 Degrees | 45 Degrees | 45 Degrees |
| | | Outer Diameter ($\phi 1$) | —* | 1 mm | 1 mm | 1 mm | 3 mm | 3 mm | 1 mm |
| | Needle-Shaped Member | Diameter ($\phi 2$) | —* | 0.6 mm | 0.6 mm | 0.6 mm | 1.8 mm | 0.5 mm | 0.8 mm |
| | | Ratio ($\phi 2/\phi 1$) | —* | 60% | 60% | 60% | 60% | 17% | 80% |
| The Number of Short-Circuited Layers | | | Uncontrollable | Controllable (One Layer) | Controllable (Two Layers) | Controllable (One Layer) | Controllable (One Layer) | Controllable (Two Layers) | Uncontrollable |

*In Comparative Example 1, an evaluation jig (a ceramic nail) in Japanese Patent Laying-Open No. 2010-250954 is used.

The embodiment and Examples in the present disclosure are illustrative and non-restrictive in every respect. The technical scope defined by the terms of the claims includes any modifications within the scope and meaning equivalent to the terms of the claims.

What is claimed is:

1. A method of evaluating a power storage device comprising at least:
preparing a power storage device, the power storage device including at least a housing and an electrode assembly, the electrode assembly being accommodated in the housing, the electrode assembly including a occurrence of short-circuiting through the needle-shaped member being detected based on the variation in second potential difference.

2. The method of evaluating a power storage device according to claim 1, wherein
the short-circuiting through the needle-shaped member is short-circuiting between one positive electrode and one negative electrode.

3. The method of evaluating a power storage device according to claim 1, wherein
the needle-shaped member causes short-circuiting between one positive electrode and one negative electrode a plurality of times.

4. An evaluation jig used in the method of evaluating a power storage device according to claim 1, the evaluation jig comprising:
- the insulating tubular member; and
- the conductive needle-shaped member,
- the needle-shaped member being inserted through the tubular member,
- the needle-shaped member being constructed to be movable independently of the tubular member, and
- a ratio of a diameter of the needle-shaped member to an outer diameter of the tubular member being not higher than 60% in a cross-section orthogonal to an axial direction of the evaluation jig.

5. A method of manufacturing a power storage device comprising at least:
- manufacturing a plurality of power storage devices; and
- evaluating one or more of the plurality of power storage devices by the method of evaluating a power storage device according to claim 1.

* * * * *